(12) United States Patent
Beer et al.

(10) Patent No.: US 9,952,110 B2
(45) Date of Patent: Apr. 24, 2018

(54) MULTI-DIE PRESSURE SENSOR PACKAGE

(71) Applicant: Infineon Technologies AG, Neubiberg (DE)

(72) Inventors: Sebastian Beer, Regensburg (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 15/084,232

(22) Filed: Mar. 29, 2016

(65) Prior Publication Data
US 2017/0284880 A1    Oct. 5, 2017

(51) Int. Cl.
*G01F 1/68* (2006.01)
*G01L 9/00* (2006.01)
*H01L 21/48* (2006.01)
*H01L 21/56* (2006.01)
*H01L 23/31* (2006.01)
*H01L 23/495* (2006.01)
(Continued)

(52) U.S. Cl.
CPC ........ *G01L 9/0041* (2013.01); *H01L 21/4853* (2013.01); *H01L 21/565* (2013.01); *H01L 23/3157* (2013.01); *H01L 23/4952* (2013.01); *H01L 23/49811* (2013.01); *G01F 15/14* (2013.01); *H01L 2224/48091* (2013.01); *H01L 2224/48247* (2013.01); *H01L 2224/48465* (2013.01); *H01L 2224/73265* (2013.01); *H01L 2224/92247* (2013.01); *H01L 2924/15151* (2013.01); *H01L 2924/181* (2013.01); *H01L 2924/1815* (2013.01)

(58) Field of Classification Search
CPC ............... H01L 21/4853; H01L 21/565; H01L 23/3157; H01L 23/4952; H01L 23/49811; H10L 2224/48137; H10L 2224/48227; H10L 2224/48247; H10L 2224/48141; G01L 9/0041; G01F 15/14
USPC ...... 73/204.26, 204.22, 754, 31.06; 257/787, 257/415–416, 432–433, 459; 29/592.1, 29/595; 438/106, 109
See application file for complete search history.

(56) References Cited

U.S. PATENT DOCUMENTS 6,891,239 B2 * 5/2005 Anderson ............... B81B 7/007
257/414
8,049,290 B2 * 11/2011 Raben .................. G01L 19/141
257/433
(Continued)

*Primary Examiner* — Jonathan Dunlap
(74) *Attorney, Agent, or Firm* — Murphy, Bilak & Homiller, PLLC

(57) ABSTRACT

A pressure sensor package includes a pressure sensor having a first side attached to a substrate and a second side opposite the first side, the first side having a pressure inlet aligned with an opening in the substrate, the second side having one or more electrical contacts. A logic die attached to an opposite side of the substrate as the pressure sensor is operable to process signals from the pressure sensor. First electrical conductors connect to the one or more electrical contacts of the pressure sensor. Second electrical conductors connect to one or more electrical contacts of the logic die. A mold compound completely encapsulates the second electrical conductors and at least partly encapsulates the logic die and the first electrical conductors. An open passage in the mold compound is aligned with the opening in the substrate so as to define a pressure port of the pressure sensor package.

19 Claims, 24 Drawing Sheets

(51) Int. Cl.
*H01L 23/498* (2006.01)
*G01F 15/14* (2006.01)

(56) References Cited

U.S. PATENT DOCUMENTS

| | | | |
|---|---|---|---|
| 8,115,286 B2* | 2/2012 | Zhang | H01L 23/3157 257/666 |
| 9,013,013 B1 | 4/2015 | Beer et al. | |
| 9,143,849 B2* | 9/2015 | Zoellin | H04R 1/04 |
| 9,190,352 B2* | 11/2015 | Tiu | H01L 23/49575 |
| 9,209,121 B2* | 12/2015 | Goida | H01L 23/04 |
| 9,628,918 B2* | 4/2017 | Ng | H04R 19/005 |
| 2007/0164402 A1* | 7/2007 | Jung | G01L 19/141 257/666 |
| 2009/0072333 A1* | 3/2009 | Haag | B81B 7/0048 257/415 |
| 2010/0133629 A1* | 6/2010 | Zhang | H01L 23/3157 257/414 |
| 2011/0036176 A1* | 2/2011 | Bradley | G01L 19/147 73/756 |
| 2011/0260266 A1* | 10/2011 | Han | G01L 19/0084 257/415 |
| 2012/0181639 A1 | 7/2012 | Ehrenpfordt et al. | |
| 2014/0217566 A1* | 8/2014 | Goida | H01L 23/04 257/676 |
| 2015/0059454 A1* | 3/2015 | Vaupel | H01L 23/3185 73/65.09 |
| 2016/0282212 A1* | 9/2016 | Beer | G01L 19/147 |

* cited by examiner

MULTI-DIE PRESSURE SENSOR PACKAGE

TECHNICAL FIELD

The instant application relates to pressure sensor packages, and more particularly to arrangement of components within pressure sensor packages.

BACKGROUND

Pressure sensors are critical components in many applications such as tire pressure monitoring. Pressure sensors are typically molded in a package to ensure the pressure sensor works reliably over a wide range of temperature, humidity and load conditions. A typical pressure sensor package includes a pressure sensor die with a pressure inlet and a logic die such as an ASIC (Application-Specific Integrated Circuit). The logic die is electrically connected to the pressure sensor and processes the signals provided by the pressure sensor.

A conventional pressure sensor package includes pressure sensor and logic dies disposed laterally adjacent one another on a different regions of a substrate such as on different die pads of a lead frame, and electrical connections are made to the dies by wire bonding. The pressure sensor is mounted in a hole in the die paddle through which the pressure signal impinges on the active surface of the pressure sensor chip such as a piezo-active suspended membrane. The assembly is encapsulated with mold compound so that the pressure inlet remains open by the injection molding tool. Electrical connections protruding from the molded package are severed from the lead frame and bent so that board mounting is possible.

The pressure sensor die should be disposed within the package so as to be immune from mechanical impact of the assembly processes and the housing (package). Such buffering is desired because mechanical stresses on the pressure sensor chip cause the sensor membrane to move and thus generate an unwanted signal. Moreover, the influence of various substances from the environment may result in corrosive effects, which can particularly affect contact pads which typically have Al, AlCu or Cu surfaces that are contacted by bond wires. The contact pads of the logic die are especially vulnerable to corrosive effects, as a partly constant electrical voltage is applied to these pads and therefore are highly susceptible to electrochemically accelerated degradation. An improved pressure sensor package is needed which adequately addresses these issues, while also having a small size.

SUMMARY

According to an embodiment of a pressure sensor package, the pressure sensor package comprises a substrate having an opening and a pressure sensor having a first side attached to the substrate and a second side opposite the first side. The first side has a pressure inlet aligned with the opening in the substrate, and the second side has one or more electrical contacts. The pressure sensor package further comprises a logic die attached to an opposite side of the substrate as the pressure sensor and operable to process signals from the pressure sensor, first electrical conductors connected to the one or more electrical contacts of the pressure sensor, and second electrical conductors connected to one or more electrical contacts of the logic die. A mold compound completely encapsulates the second electrical conductors and at least partly encapsulates the logic die and the first electrical conductors. An open passage in the mold compound is aligned with the opening in the substrate so as to define a pressure port of the pressure sensor package.

According to an embodiment of a method of manufacturing a pressure sensor package, the method comprises: attaching a first side of a pressure sensor to a substrate which has an opening, the pressure sensor having a second side opposite the first side, the first side having a pressure inlet aligned with the opening in the substrate, the second side having one or more electrical contacts; attaching a logic die to an opposite side of the substrate as the pressure sensor, the logic die operable to process signals from the pressure sensor; connecting first electrical conductors to the one or more electrical contacts of the pressure sensor; connecting second electrical conductors to one or more electrical contacts of the logic die; completely encapsulating the second electrical conductors and at least partly encapsulating the logic die and the first electrical conductors in a mold compound; and forming an open passage in the mold compound which is aligned with the opening in the substrate so as to define a pressure port of the pressure sensor package.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, a pressure sensor package is provided which comprises a pressure sensor and a logic die for processing signals from the pressure sensor. The pressure sensor has a first side with a pressure inlet, a second side opposite the first side, and electrical contacts at the second side opposite the pressure inlet. The logic die is attached to the same substrate as the pressure sensor, but at the opposite side of the substrate as the pressure sensor. Mold compound completely encapsulates the electrical conductors connected to the electrical contacts of the logic die so as to eliminate corrosive effects, since a partly constant electrical voltage is applied to the logic die via at least some of these conductors. The mold compound also at least partly encapsulates the logic die and the electrical conductors connected to the electrical contacts of the pressure sensor. An open passage in the mold compound is aligned with the opening in the substrate and the pressure inlet of the pressure sensor so as to define a pressure port of the pressure sensor package.

Figure 1:
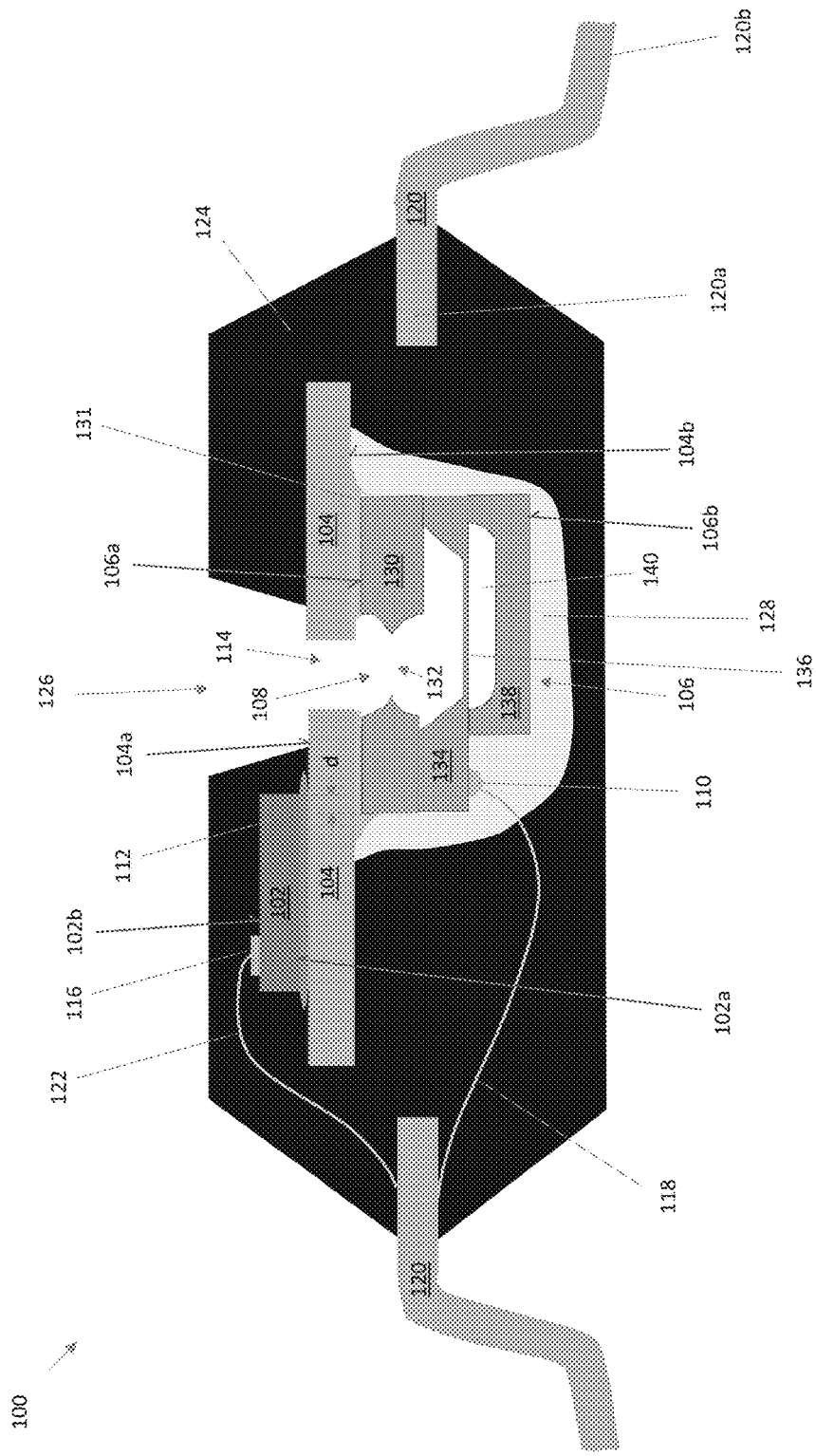
FIG. 1 illustrates a cross-sectional view of an embodiment of a pressure sensor package having a pressure sensor and a logic die attached to opposite sides of the same substrate.

FIG. 1 illustrates an embodiment of a pressure sensor package 100 with a logic die 102 attached to the opposite side 104a of a substrate 104 as a pressure sensor 106 so as to reduce the size of the pressure sensor package 100. The substrate 104 can be a circuit board such as a PCB (printed circuit board), a ceramic substrate, part of a lead frame, etc. In each case, the pressure sensor 106 has a first side 106a with a pressure inlet 108, a second side 106b opposite the first side 106a, and electrical contacts 110 at the second side 106b opposite the pressure inlet 108. In general, any standard pressure sensor die can be used. The pressure sensor 106 can include active device areas including transistors e.g. for sensing acceleration. The logic die 102 has a first side 102a attached to the opposite side 104a of the substrate 104 as the pressure sensor 106 e.g. by an adhesive, solder or other standard die attach material 112.

The substrate 104 has an opening 114, and the pressure inlet 108 at the first side 106a of the pressure sensor 106 is aligned with the opening 114 in the substrate 104. The logic die 102 and the pressure sensor 106 can at least partly overlap by an amount d in a vertical direction perpendicular to the first side 106a of the pressure sensor 106. The logic die 102 can be an ASIC, processor or other type of electronic circuit operable to process signals from the pressure sensor 106. This can include signal conditioning, amplification, digitizing, transmitting, receiving, etc. The second side 102b of the logic die 102 opposite the first side 102a has electrical contacts 116 for the logic die 102. First electrical conductors 118 connect the electrical contacts 110 of the pressure sensor 106 to one or more external electrical contacts 120 of the pressure sensor package 100. Second electrical conductors 122 connect the electrical contacts 116 of the logic die 102 to one or more of the external electrical contacts 120 of the pressure sensor package 100. The external electrical contacts 120 provide points of electrical connection to the pressure sensor 106 and logic die 102 disposed within the package 100, and allow for internal connections between the pressure sensor 106 and the logic die 102. In FIG. 1, the electrical conductors 118, 122 are shown as bond wires. However, other types of electrical conductors can be used such as ribbons, metal clips, etc.

A mold compound 124 completely encapsulates the second electrical conductors 122 and at least partly encapsulates the logic die 102 and the first electrical conductors 118. An open passage 126 in the mold compound 124 is aligned with the opening 114 in the substrate 104 and the pressure inlet 108 of the pressure sensor 106 so as to define a pressure port of the pressure sensor package 100. The pressure sensor 106 and part of the electrical conductors 118 connected to the electrical contacts 110 of the pressure sensor 106 can be covered by a silicone gel 128. The silicone gel 128 is interposed between the mold compound 124 and the pressure sensor 106 so as to decouple the pressure sensor 106 from mechanical stress generated by the mold compound 124. Any standard silicone gel can be used.

According to the embodiment shown in FIG. 1, the external electrical contacts 120 of the pressure sensor package 100 are leads embedded in the mold compound 124 at a first end 120a and which protrude out of the mold compound 124 at a second end 120b. The second end 120b of the leads provide points of external contact for the pressure sensor package 100. The first electrical conductors 118 connect the one or more electrical contacts 110 of the pressure sensor 106 to one or more of the leads 120. The second electrical conductors 122 connect the one or more electrical contacts 116 of the logic die 102 to one or more of the leads 120. In one embodiment, the first end 120a of the leads 120 terminate in the mold compound 124 at a different level than the substrate 104 so that the first end 120a of the leads 120 and the substrate 104 are vertically offset within the mold compound 124. In another embodiment, the pressure sensor package 100 is a leadless package.

Further according to the embodiment shown in FIG. 1, the pressure sensor 106 includes a first glass substrate 130 attached to the opposite side 104b of the substrate 104 as the logic die 102 e.g. by an adhesive, solder or other standard die attach material 131. The first glass substrate 130 has an opening 132 which forms the pressure inlet 108. The pressure sensor 106 further includes a semiconductor die 134 stacked on the first glass substrate 130 and which has a piezo-active suspended membrane 136, and a second glass substrate 138 stacked on the semiconductor die 134 and which has a cavity 140. The pressure port 108 of the pressure sensor package 100 is further defined by the opening 132 in the first glass substrate 130.

Signals provided by the semiconductor die 134 correspond to the amount of movement or displacement of the piezo-active suspended membrane 136 in response to the amount of air flow impinging on the membrane 136 through the pressure port. To this end, the opening 132 in the first glass substrate 130 is aligned with the open passage 126 of the mold compound 124 and with the membrane 136 at one side of the membrane 136 to permit air flowing into the open passage 126 to impinge upon the membrane 136. The cavity 140 in the second glass substrate 138 is aligned with the membrane 136 at the opposite side of the membrane 136 as the opening 132 in the first glass substrate 130 to permit movement of the membrane 136 in response to the air flow.

FIGS. 2A through 2F illustrate an embodiment of a method of manufacturing the pressure sensor package 100 shown in FIG. 1.

Figure 2A:
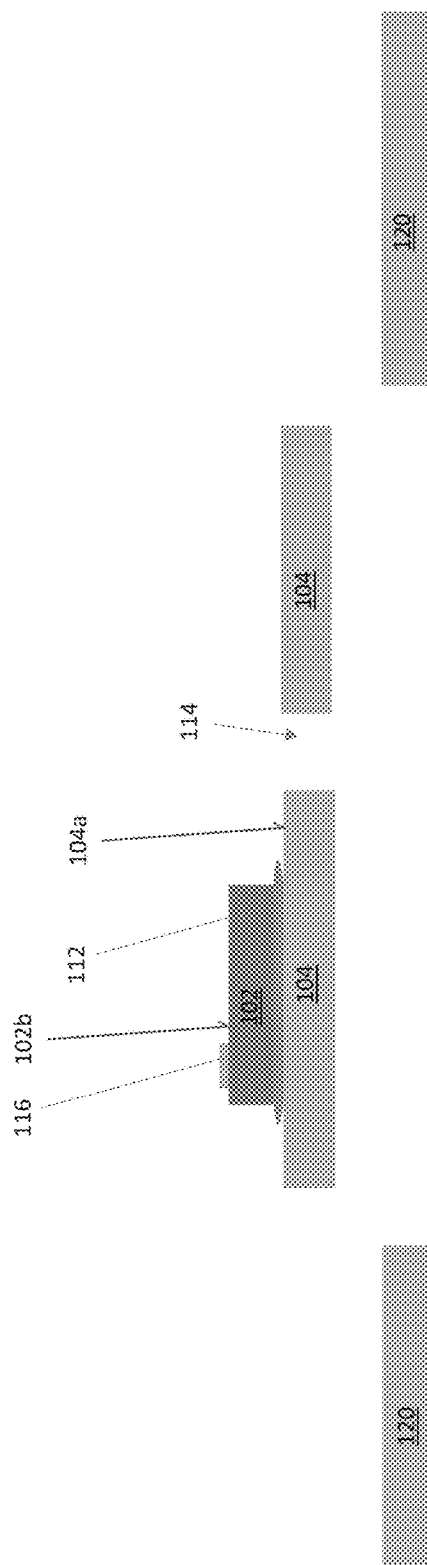
FIGS. 2A through 2F illustrate different stages of an embodiment of a method of manufacturing the pressure sensor package shown in FIG. 1.

In FIG. 2A, the substrate 104 and leads 120 of the pressure sensor package 100 are provided e.g. in the form of a lead frame. The logic die 102 is attached to the substrate 104 using any standard die attach process such as soldering, gluing, etc. In the case of the pressure sensor 106 being mounted to a metal die pad of a copper lead frame, the die pad can have a plurality of support structures or so-called tie bars (not shown in FIG. 2A) extending outward from the die pad and connecting the die pad to the periphery of the copper lead frame. Lead frames are typically constructed from flat sheet metal, e.g. by stamping or etching. For example, the sheet metal can be exposed to chemical etchants that remove areas not covered by photoresist. Other processing can be performed, e.g. laser etching to pattern the sheet metal. After the patterning process, the patterned frames are singulated (separated) into lead frames. Part of one such lead frame which has a die pad and leads is shown in FIG. 2A, where the die pad corresponds to substrate 104 and the leads correspond to external contacts 120.

Figure 2B:
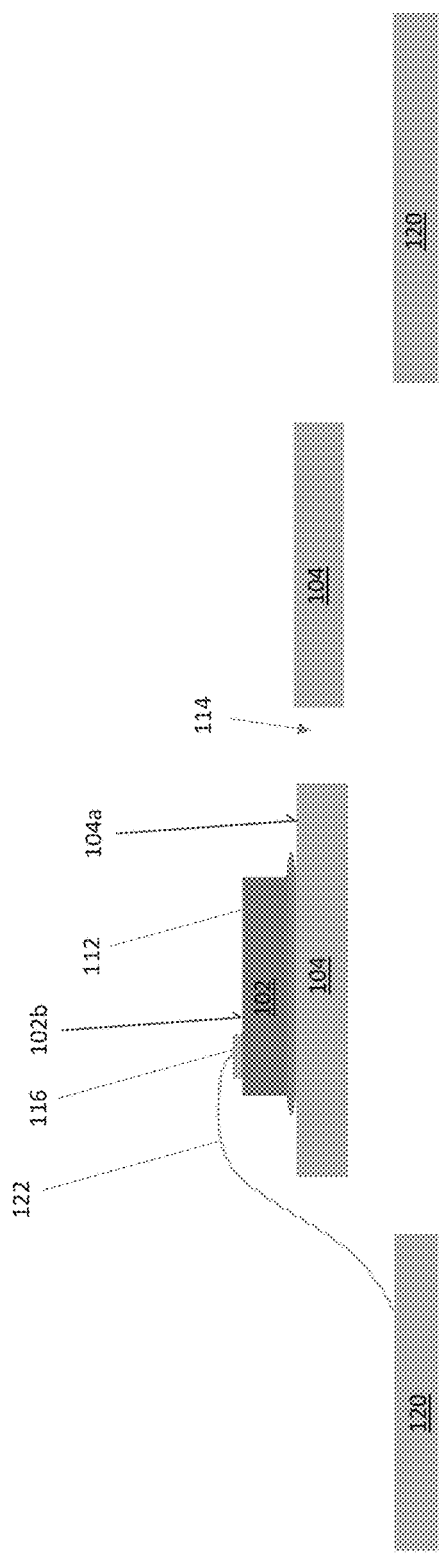

In FIG. 2B, bond wires 122 are connected at one end to the electrical contacts 116 of the logic die 102 and to the leads 120 at the opposite end. Bond wires, ribbons, metal clips, etc. can be used to form these connections.

Figure 2C:
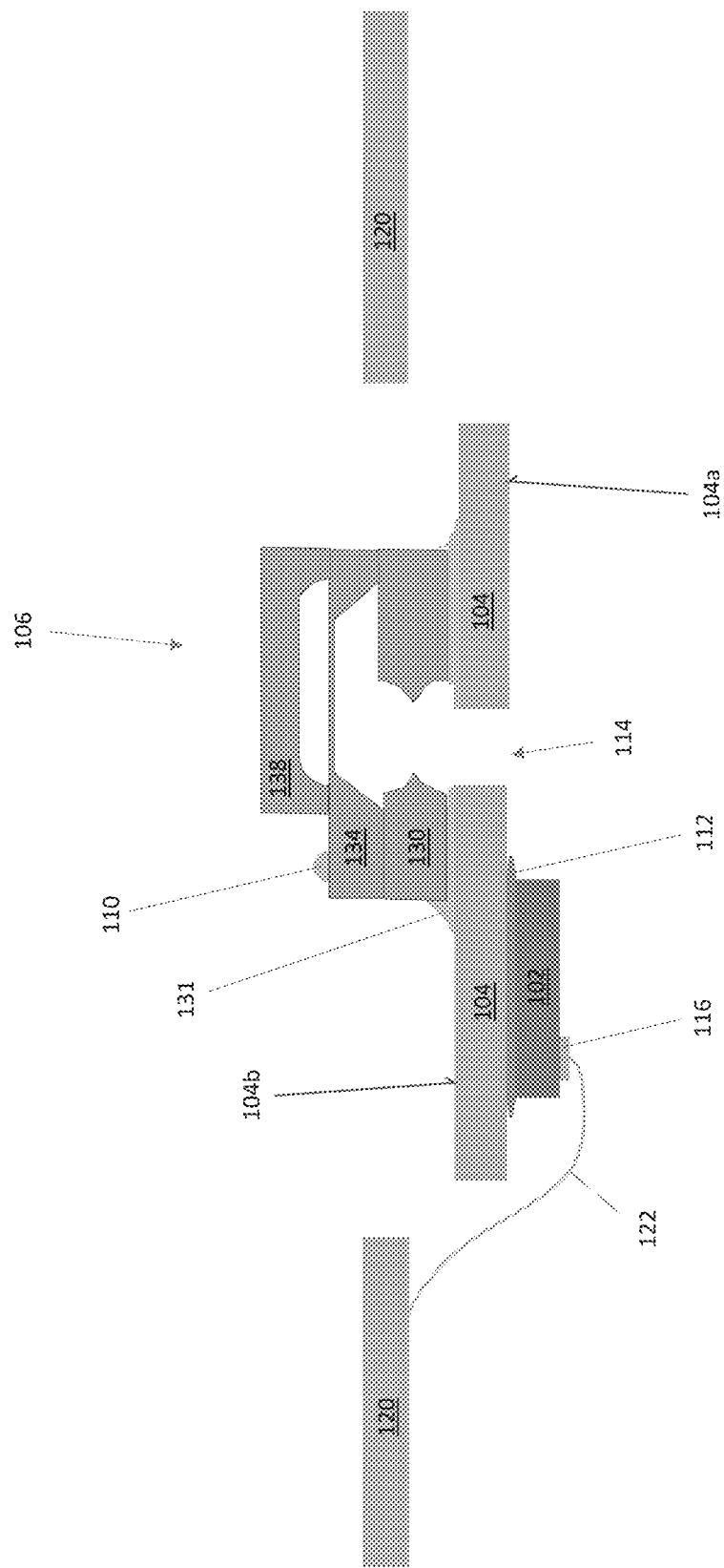

In FIG. 2C, the package assembly is flipped and the pressure sensor 106 is attached to the opposite side 104b of the substrate 104 as the logic die 102 using any standard die attach process such as soldering, gluing, etc.

Figure 2D:
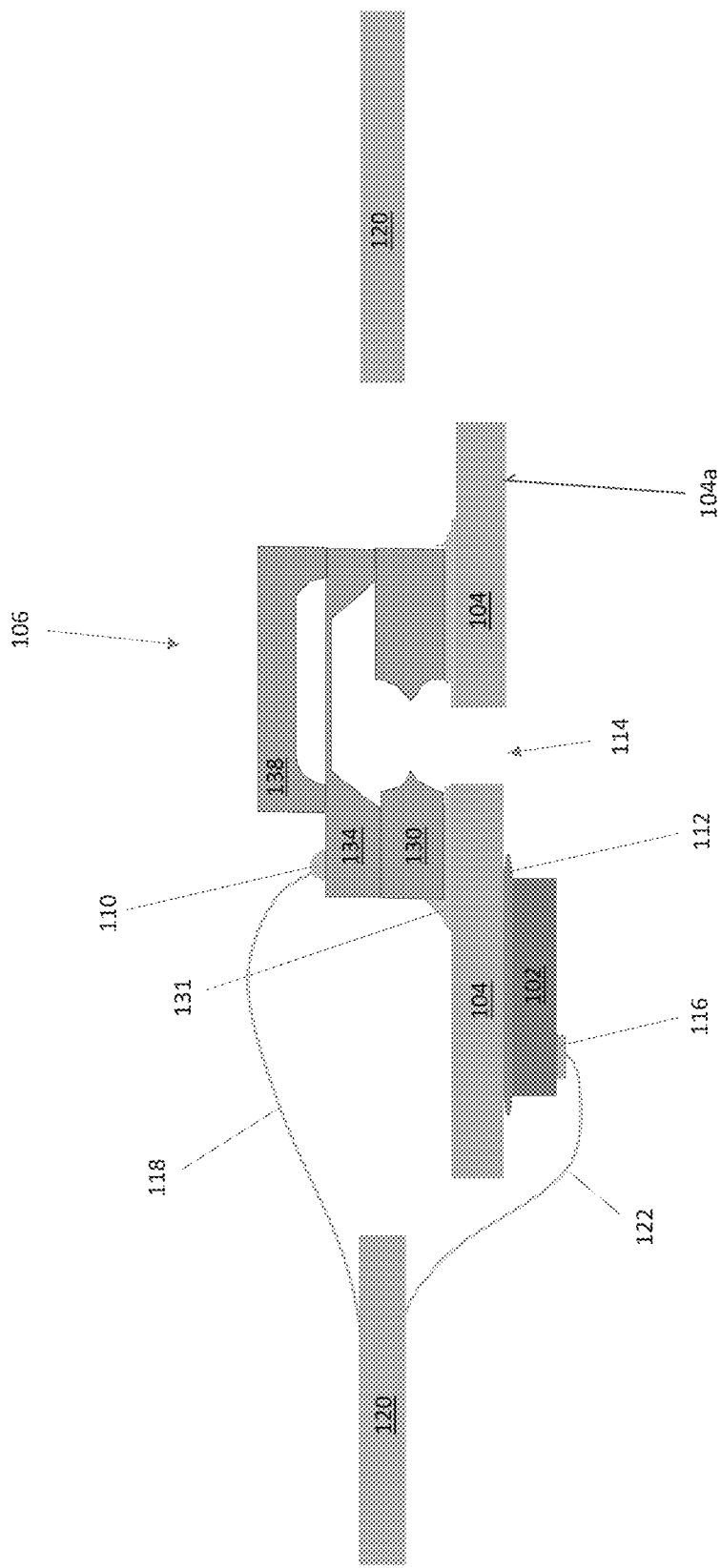

In FIG. 2D, bond wires 118 are connected at one end to the electrical contacts 116 of the pressure sensor 106 and to the leads 120 at the opposite end. Bond wires, ribbons, metal clips, etc. can be used to form these connections.

Figure 2E:
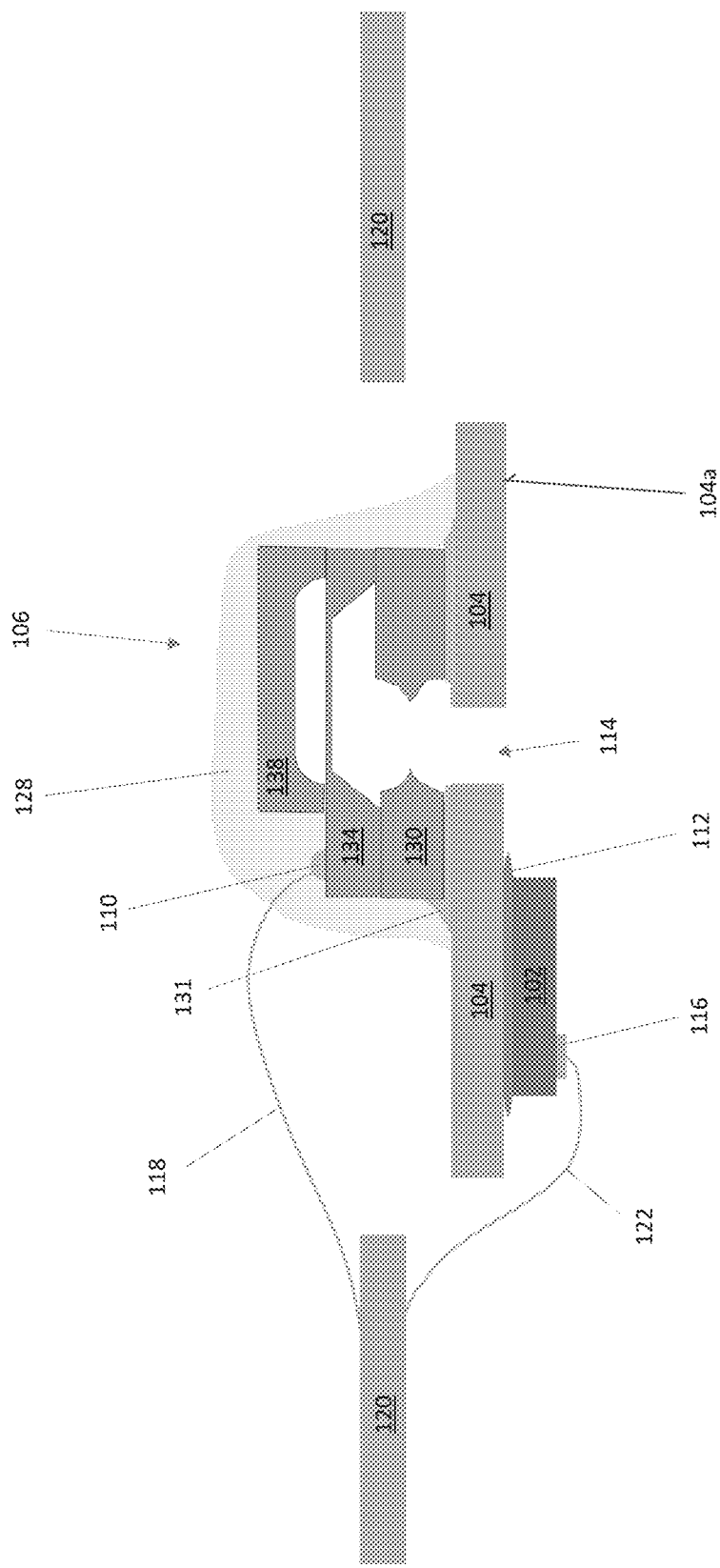

In FIG. 2E, the pressure sensor 106 and part of the bond wires 118 connected to the electrical contacts 110 of the pressure sensor 106 are covered with a silicone gel 128. The silicone gel 128 is subjected to a curing process. Any standard silicone gel can be used.

Figure 2F:
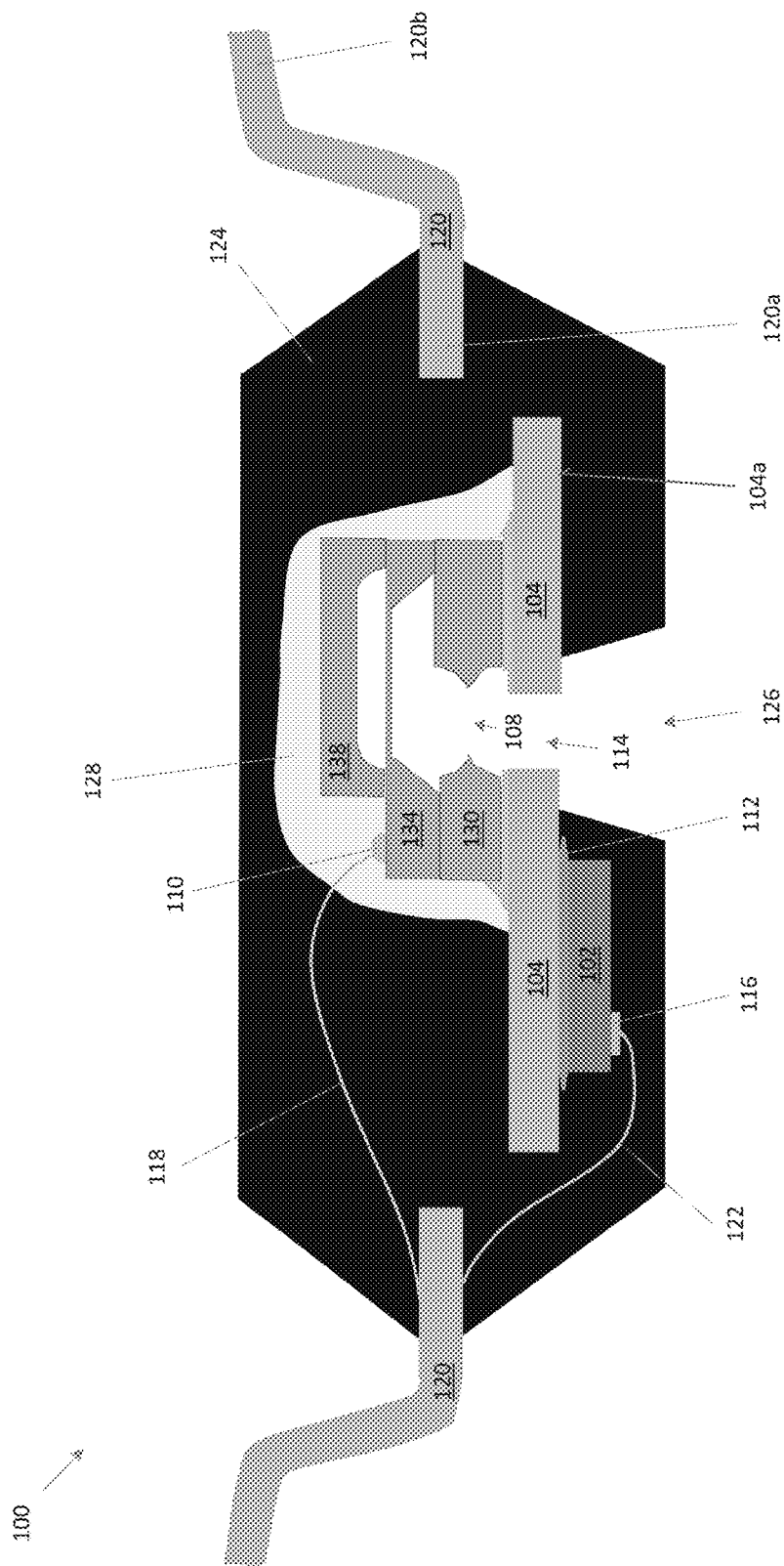

In FIG. 2F, the package assembly is molded in a molding tool. The resulting mold compound 124 completely encapsulates the logic die 102 and the bond wires 122 connected to the electrical contacts 116 of the logic die 102. The mold compound 124 also partly encapsulates the bond wires 118 connected to the electrical contacts 110 of the pressure sensor 106. The pressure sensor 106 is encapsulated by the silicones gel 128, which in turn is encapsulated by the mold compound 124 so as to provide a mechanical stress relief buffer between the pressure sensor 106 and the mold compound 124. The molding tool is designed such that an open passage 126 is formed in the mold compound 124 which is aligned with the opening 114 in the substrate 104 the pressure inlet 108 of the pressure sensor 106 so as to define a pressure port of the pressure sensor package 100. In the case of a lead frame-based substrate 104, the lead frame is trimmed and the leads 120 are bent.

Figure 3:
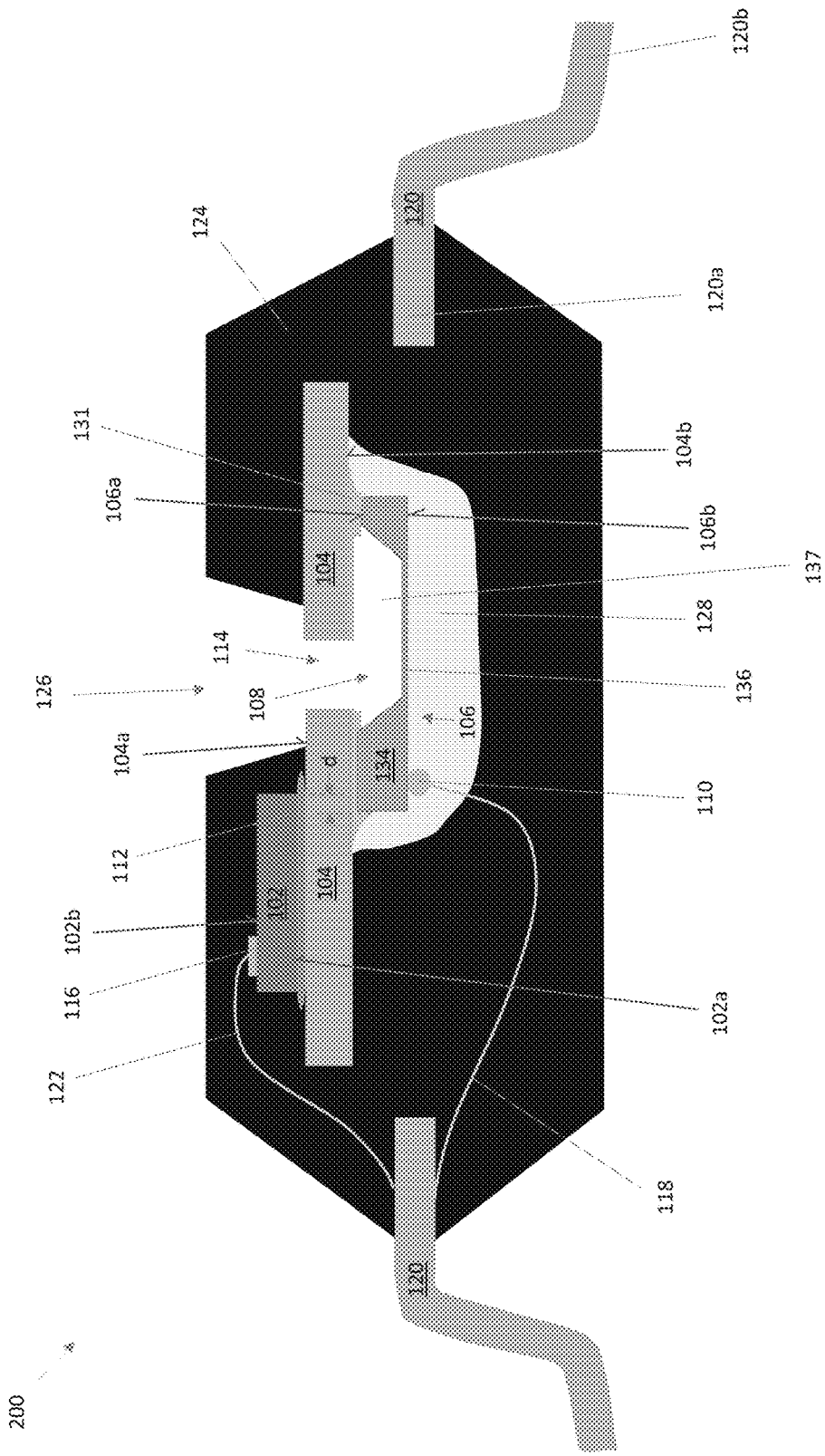
FIG. 3 illustrates a cross-sectional view of another embodiment of a pressure sensor package having a pressure sensor and a logic die attached to opposite sides of the same substrate.

FIG. 3 illustrates another embodiment of a pressure sensor package 200. The embodiment shown in FIG. 3 is similar to the embodiment shown in FIG. 1. Different, however, both glass substrates 130, 136 of the pressure sensor 106 are omitted. As such, the semiconductor die 134 of the pressure sensor 106 is attached to the opposite side 104b of the substrate 104 as the logic die 102 instead of a glass substrate. The pressure sensor semiconductor die 134 has a piezo-active suspended membrane 136 and a recessed region 137. The pressure port of the pressure sensor package 200 is further defined by the recessed region 137 of the pressure sensor semiconductor die 134 according to this embodiment. Also, the recessed region 137 of the pressure sensor semiconductor die 134 is aligned with the membrane 136 so as to permit air flowing into the pressure port to impinge upon the membrane 136.

Figure 4:
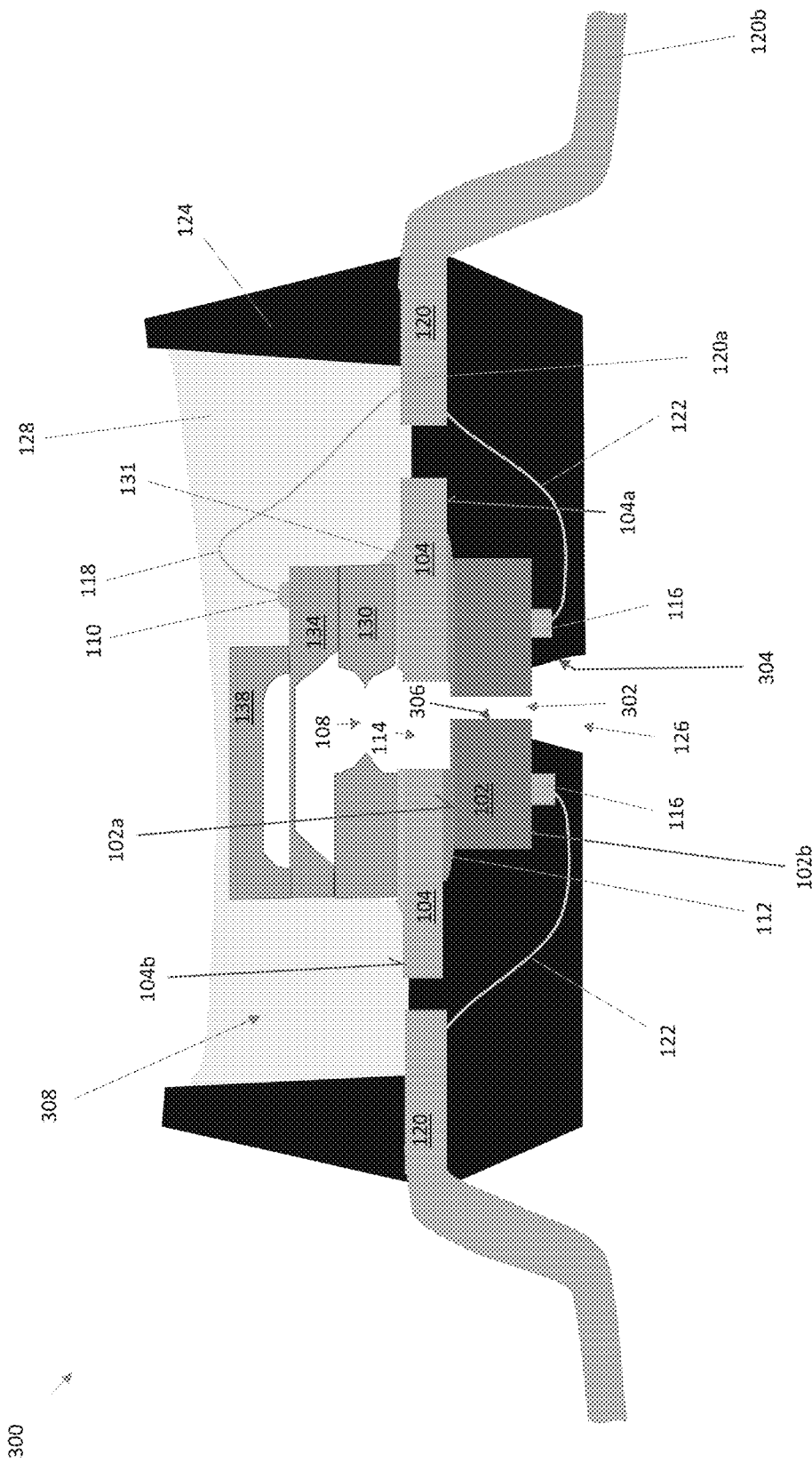
FIG. 4 illustrates a cross-sectional view of another embodiment of a pressure sensor package having a pressure sensor and a logic die attached to opposite sides of the same substrate.

FIG. 4 illustrates yet another embodiment of a pressure sensor package 300. The embodiment shown in FIG. 4 is similar to the embodiment shown in FIG. 1. Different, however, the logic die 102 has an opening 302 aligned with the open passage 126 in the mold compound 124 and the opening 114 in the substrate 104. Accordingly, the pressure port of the pressure sensor package 300 is further defined by the opening 302 in the logic die 102. Also, each sidewall 304 which defines the open passage 126 in the mold compound 124 terminates at a surface 102b of the logic die 102 facing away from the substrate 104. Each sidewall 306 which defines the opening 302 in the logic die 102 is therefore uncovered by the mold compound 124. Also different from the embodiment shown in FIG. 1, the substrate 104 is premolded prior to attachment of the pressure sensor 106. That is, the logic die 102 is attached to one side 104a of the substrate 104 and then the package assembly is molded. The premolded package assembly has a cavity 308 in the mold compound 124 at the opposite side 104b of the substrate 104 as the logic die 102. The pressure sensor 106 is placed in the cavity 108 and attached to this side 104b of the substrate 104.

FIGS. 5A through 5F illustrate an embodiment of a method of manufacturing the pressure sensor package 300 shown in FIG. 4.

Figure 5A:
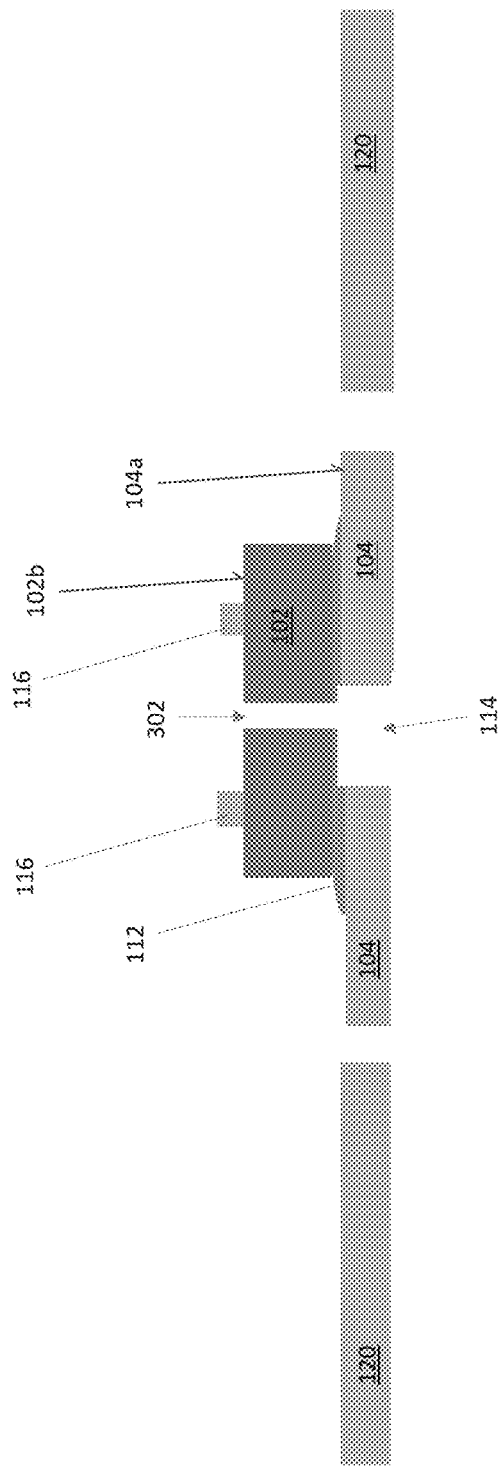
FIGS. 5A through 5F illustrate different stages of an embodiment of a method of manufacturing the pressure sensor package shown in FIG. 4.

In FIG. 5A, the substrate 104 and leads 120 of the pressure sensor package 300 are provided e.g. in the form of a lead frame. The logic die 102 is attached to the substrate 104 using any standard die attach process such as soldering, gluing, etc. The logic die 102 is attached to the substrate 104 such that the opening 302 in the logic die 102 is aligned with the opening 114 in the substrate 104.

Figure 5B:
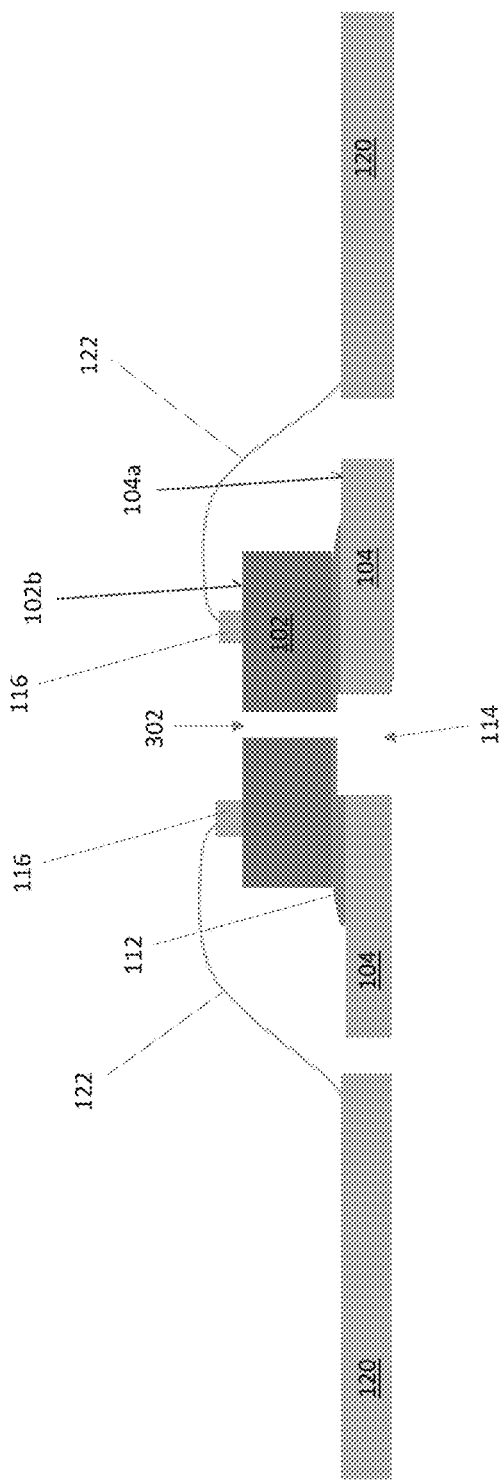

In FIG. 5B, bond wires 122 are connected at one end to the electrical contacts 116 of the logic die 102 and to the leads 120 at the opposite end. Bond wires, ribbons, metal clips, etc. can be used to form these connections.

Figure 5C:
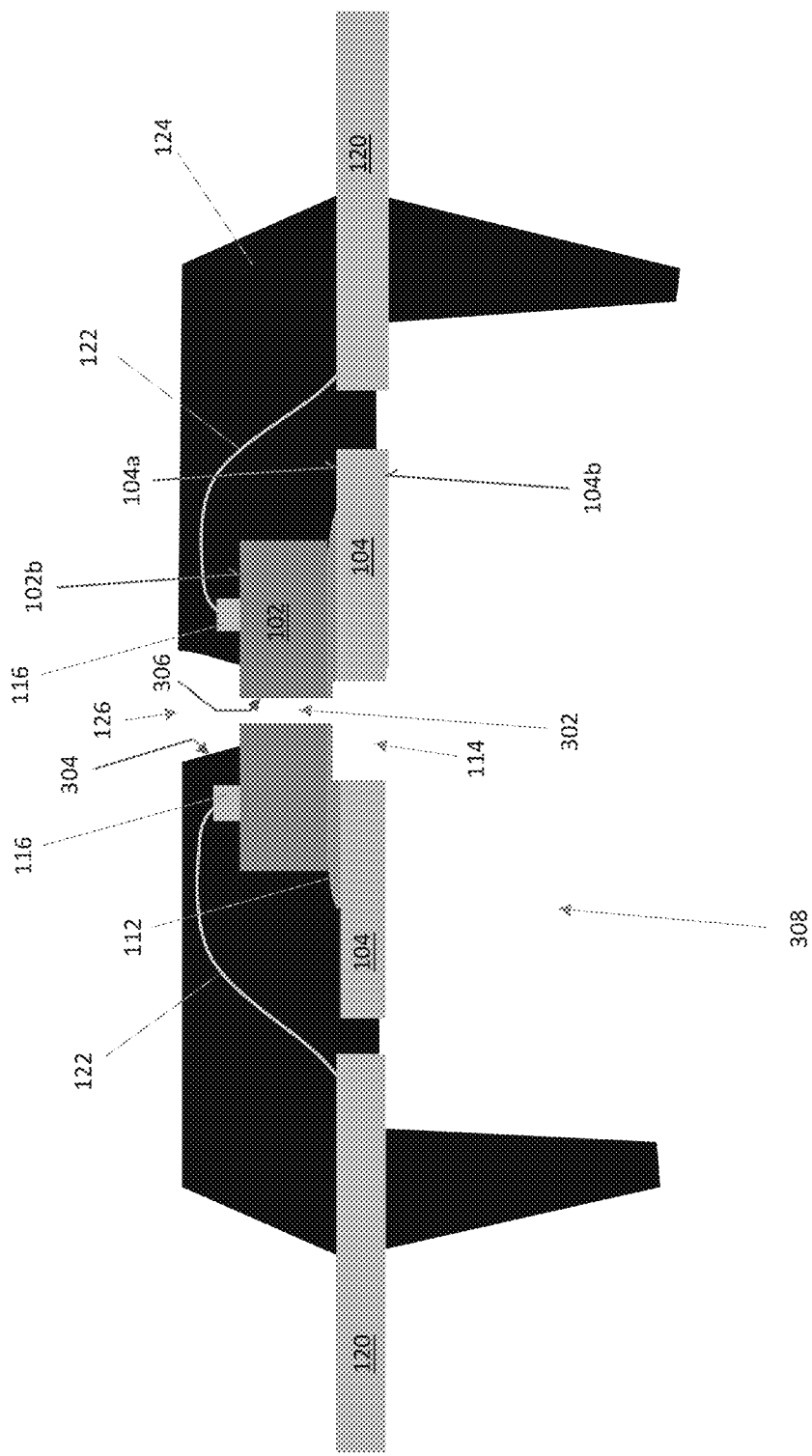

In FIG. 5C, the package assembly is molded in a molding tool. The molding tool is designed such that an open passage 126 is formed in the mold compound 124 which is aligned with the opening 114 in the substrate 104 and the opening 302 in the logic die 102. The pressure port of the pressure sensor package is further defined by the opening 302 in the logic die 102. Each sidewall 304 which defines the open passage 126 in the mold compound 124 extends to and terminates at the surface 102b of the logic die 102 facing away from the substrate 104. Each sidewall 306 which defines the opening 302 in the logic die 102 is uncovered by the mold compound 124. The molding tool is further designed such that the resulting premolded package assembly has a cavity 308 in the mold compound 124 at the opposite side 104b of the substrate 104 as the logic die 102. The molding process employed is capable of forming a seal on the surface 102b of the logic die 102 facing away from the substrate 104. In one embodiment, a film-assisted molding process is employed in which one or more plastic films are used in a mold. The film(s) are sucked down into the inner surfaces of the mold (culls, runners and cavities) before the lead frame/substrate 104 and logic die 102 are loaded into the mold. A standard transfer molding process then follows.

Figure 5D:
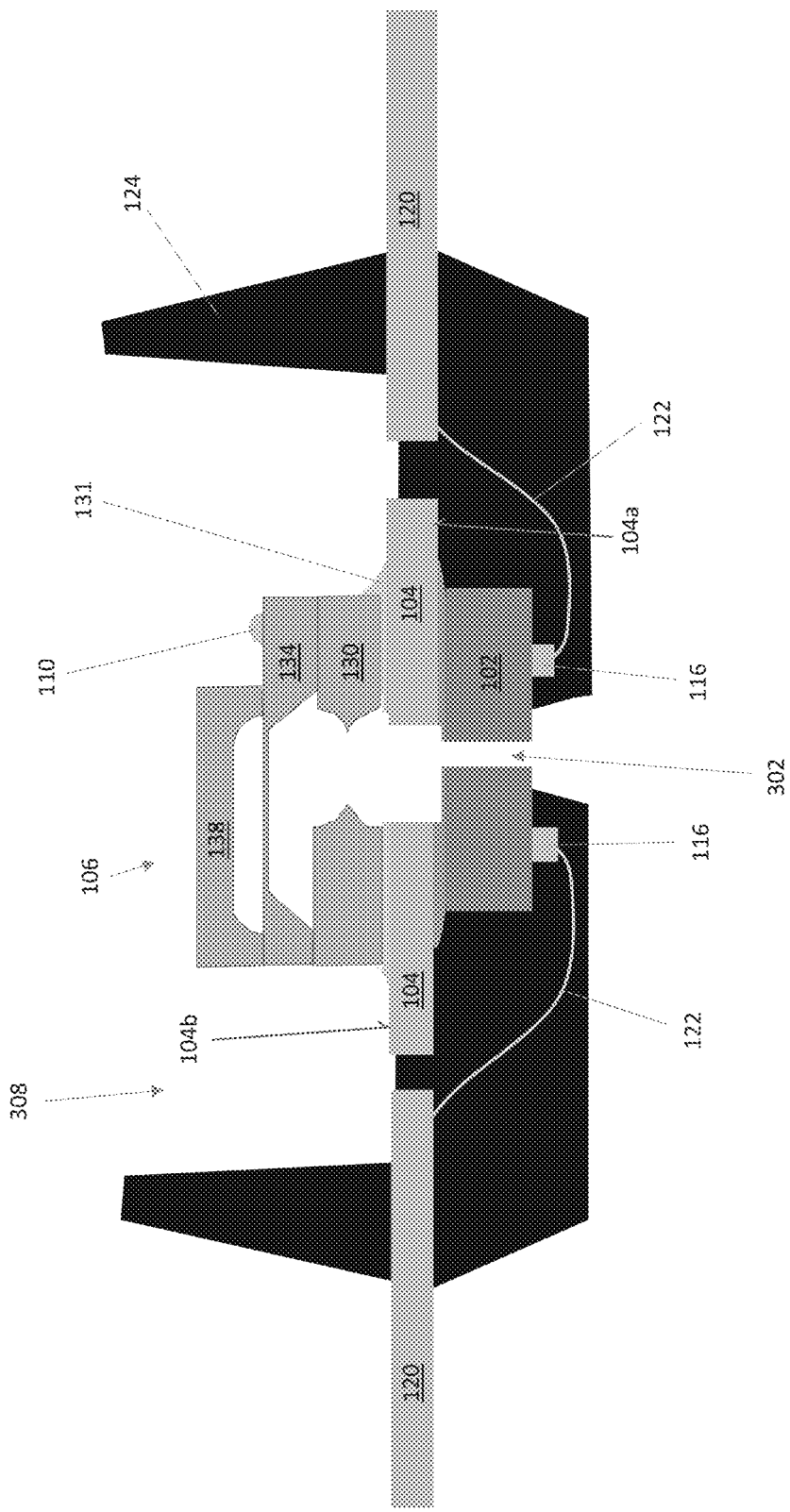

In FIG. 5D, the package assembly is flipped and the pressure sensor 106 is placed in the cavity 308 previously formed in the mold compound 124 and attached to the opposite side 104b of the substrate 104 as the logic die 102 using any standard die attach process such as soldering, gluing, etc.

Figure 5E:
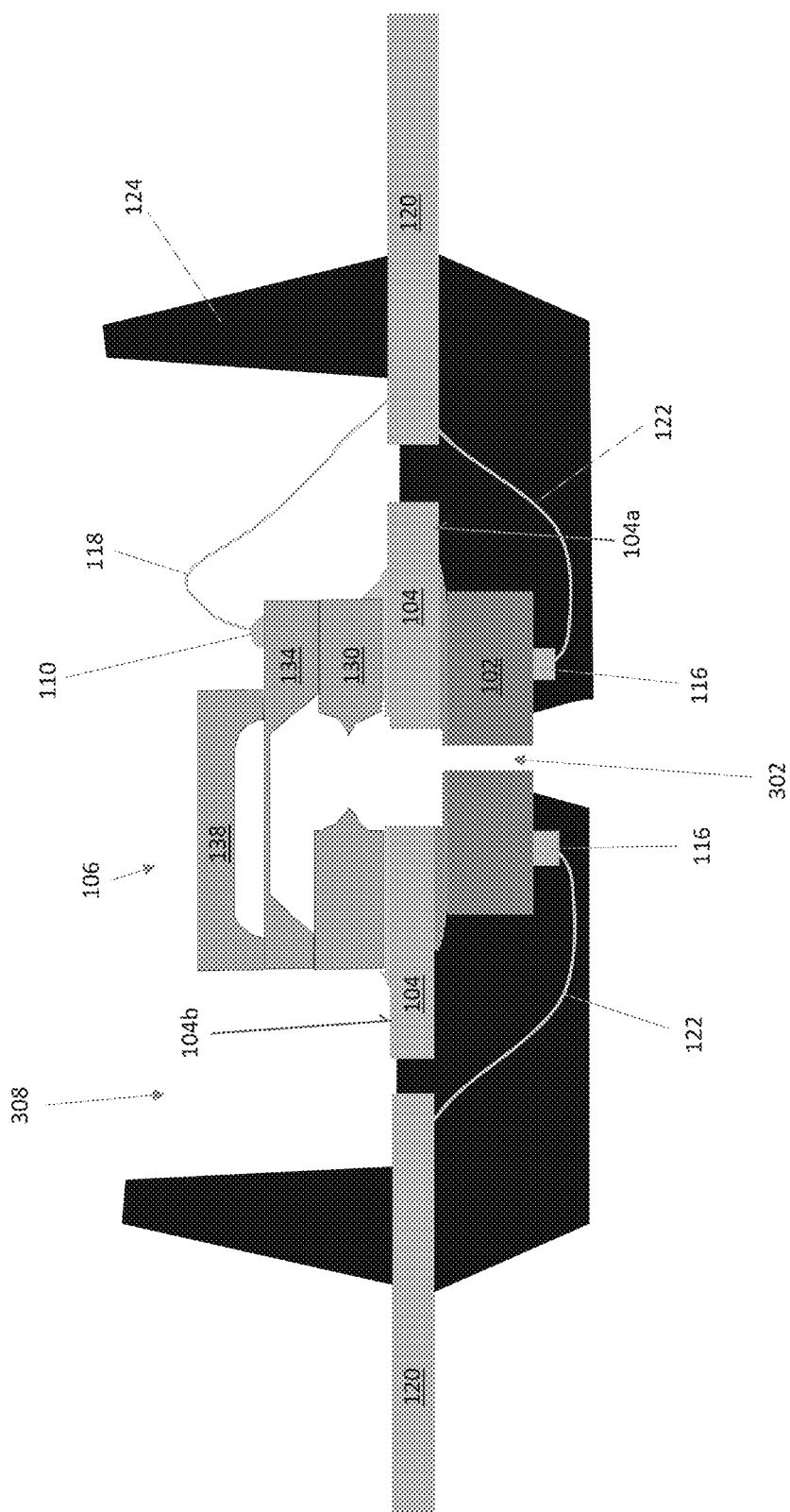

In FIG. 5E, bond wires 118 are connected at one end to the electrical contacts 110 of the pressure sensor 106 and to the leads 120 at the opposite end. Bond wires, ribbons, metal clips, etc. can be used to form these connections.

Figure 5F:
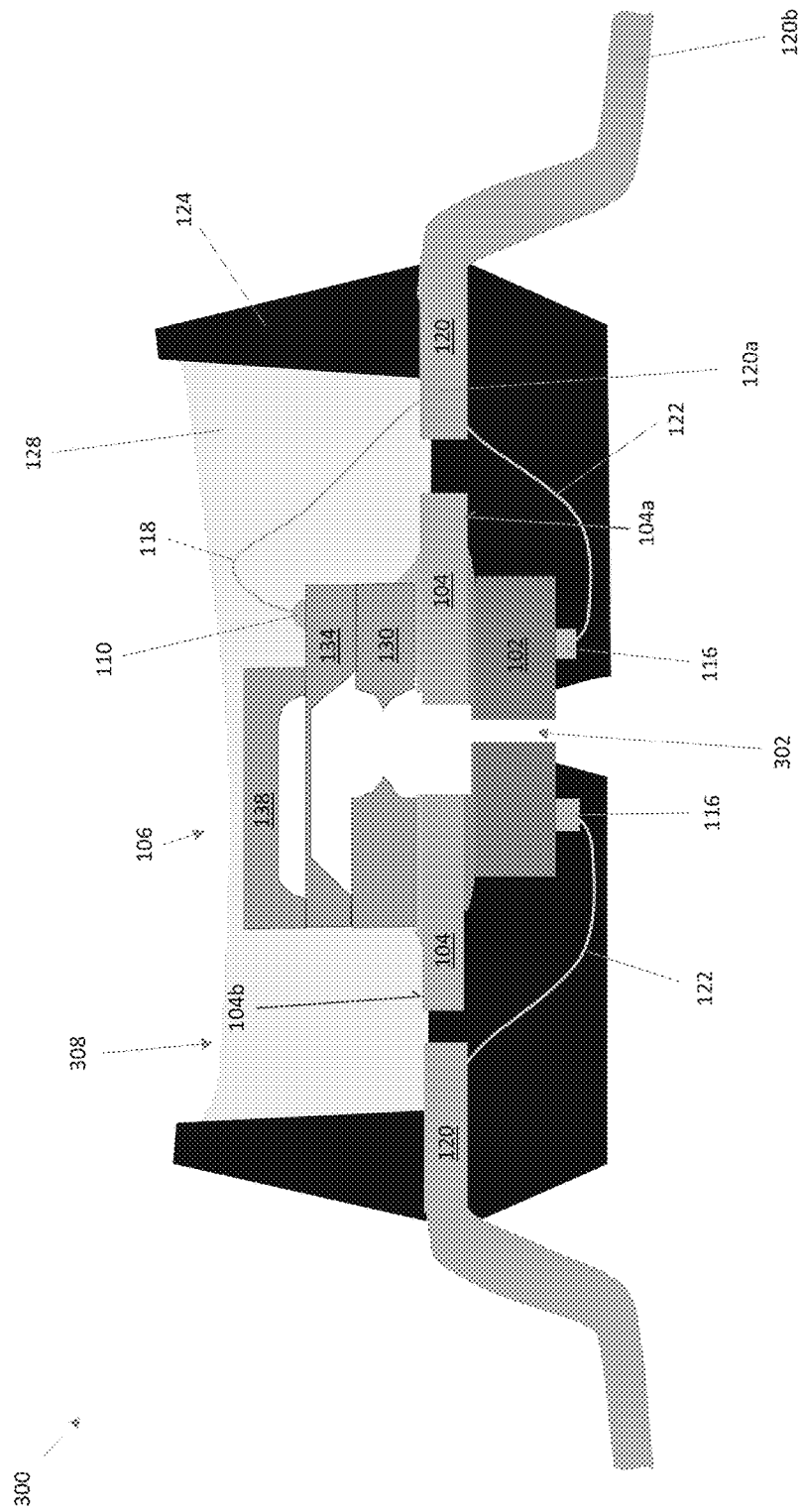

In FIG. 5F, the pressure sensor 106 and the bond wires 118 connected to the electrical contacts 110 of the pressure sensor 106 are covered with a silicone gel 128 which is subjected to a curing process. In the case of a lead frame-based substrate 104, the lead frame is then trimmed and the leads 120 can be bent if desired. Alternatively, the package assembly can be molded after both the logic die 102 and pressure sensor 106 are attached to opposite sides 104a, 104b of the substrate 104 and after the silicone gel 128 is provided and cured e.g. as described above in connection with FIG. 2F.

Figure 6:
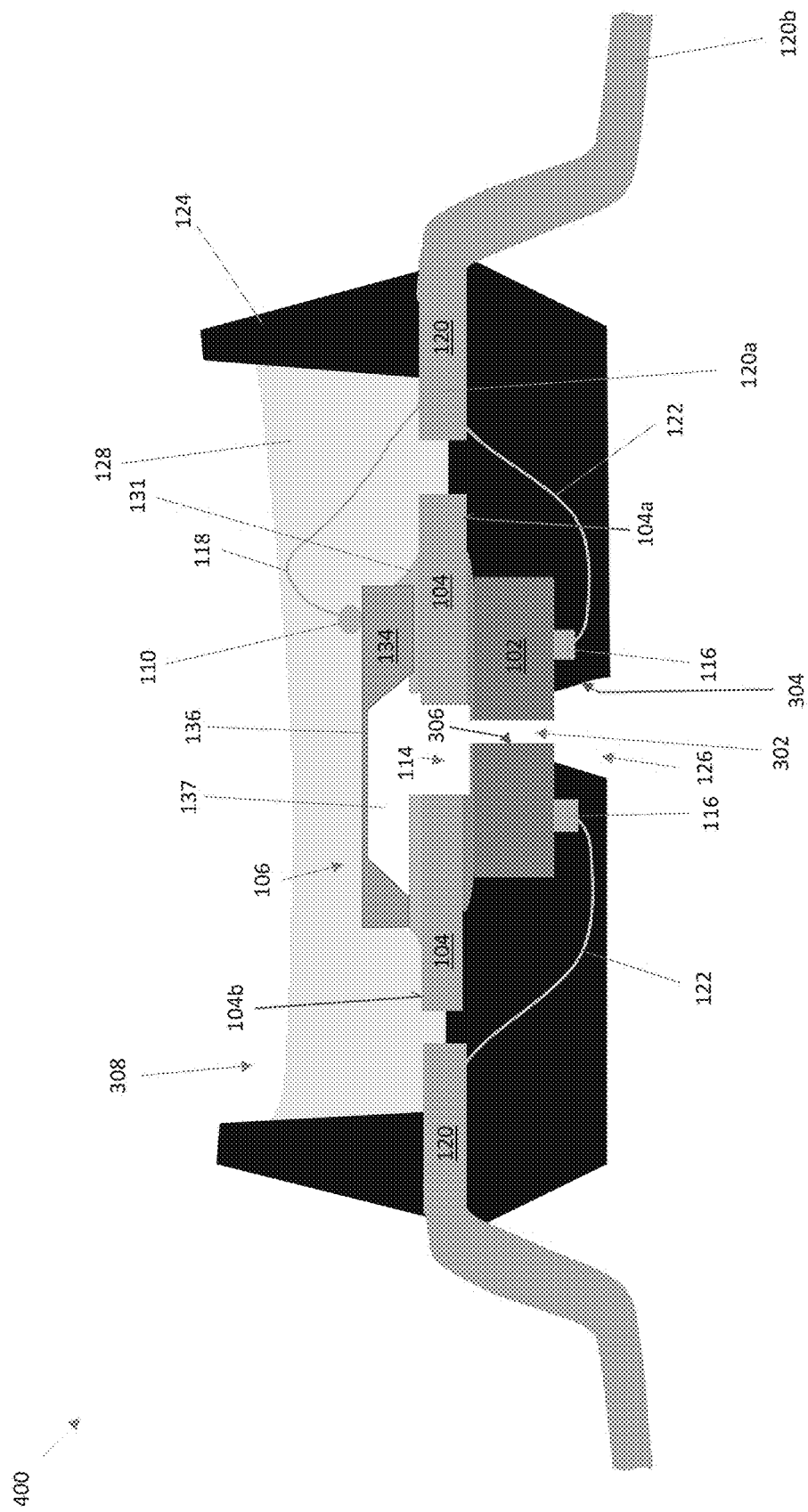
FIG. 6 illustrates a cross-sectional view of another embodiment of a pressure sensor package having a pressure sensor and a logic die attached to opposite sides of the same substrate.

FIG. 6 illustrates still another embodiment of a pressure sensor package 400. The embodiment shown in FIG. 6 is similar to the embodiment shown in FIG. 4. Different, however, both glass substrates 130, 136 of the pressure sensor 106 are omitted. As such, the semiconductor die 134 of the pressure sensor 106 is attached to the opposite side 104b of the substrate 104 as the logic die 102 instead of a glass substrate. The pressure sensor semiconductor die 134 has a piezo-active suspended membrane 136 and a recessed region 137 and the pressure port of the pressure sensor package 400 is further defined by the recessed region 137 of the pressure sensor semiconductor die 134 as previously described herein connection with FIG. 3. Different from FIG. 3, the logic die 102 has an opening 302 aligned with the open passage 126 in the mold compound 124 and the opening 114 in the substrate 104 so as to permit air flowing into the pressure port to impinge upon the membrane 136 of the pressure sensor semiconductor die 134.

Figure 7:
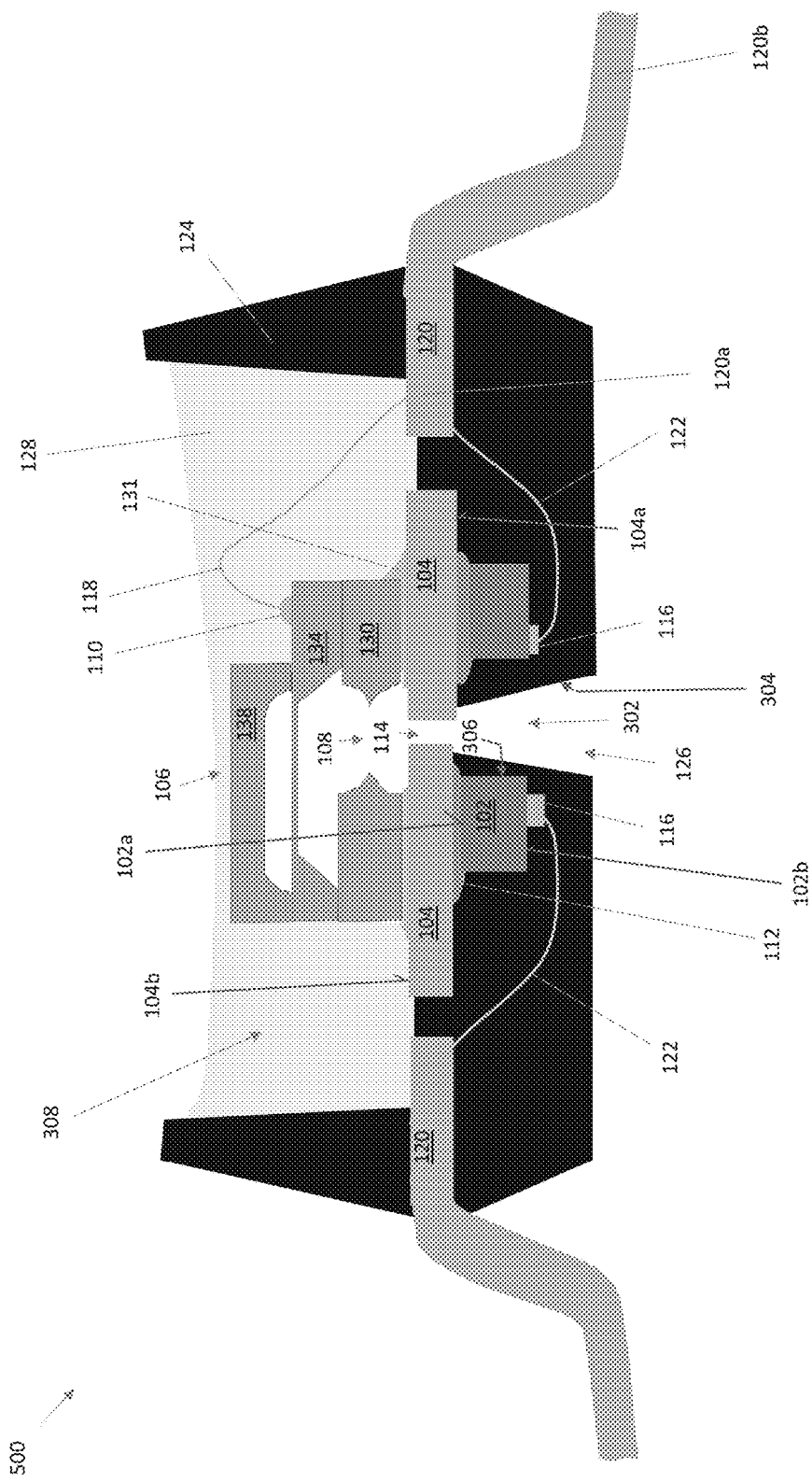
FIG. 7 illustrates a cross-sectional view of another embodiment of a pressure sensor package having a pressure sensor and a logic die attached to opposite sides of the same substrate.

FIG. 7 illustrates another embodiment of a pressure sensor package 500. The embodiment shown in FIG. 7 is similar to the embodiment shown in FIG. 4. Different, however, each sidewall 304 which defines the open passage 126 in the mold compound 124 terminates at the surface 104a of the substrate 104 to which the logic die 102 is attached. Also, each sidewall 306 which defines the opening 302 in the logic die 102 is covered by the mold compound 124.

FIGS. 8A through 8F illustrate an embodiment of a method of manufacturing the pressure sensor package 500 shown in FIG. 7.

Figure 8A:
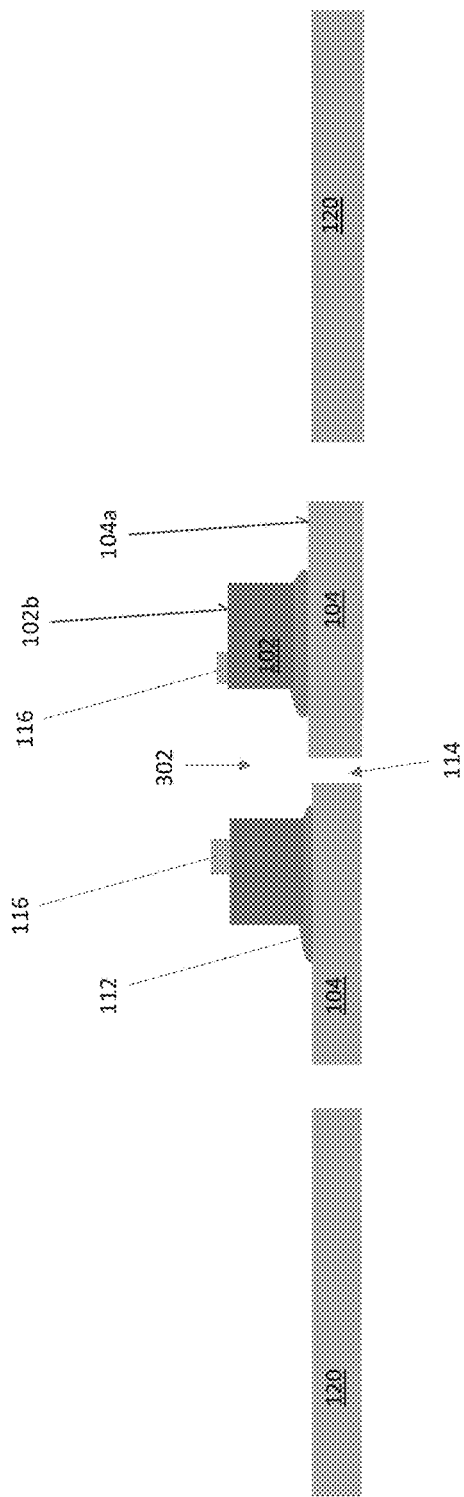
FIGS. 8A through 8F illustrate different stages of an embodiment of a method of manufacturing the pressure sensor package shown in FIG. 7.

In FIG. 8A, the substrate 104 and leads 120 of the pressure sensor package 500 are provided e.g. in the form of a lead frame. The logic die 102 is attached to the substrate 104 using any standard die attach process such as soldering, gluing, etc. The logic die 102 is attached to the substrate 104 such that the opening 302 in the logic die 102 is aligned with the opening 114 in the substrate 104.

Figure 8B:
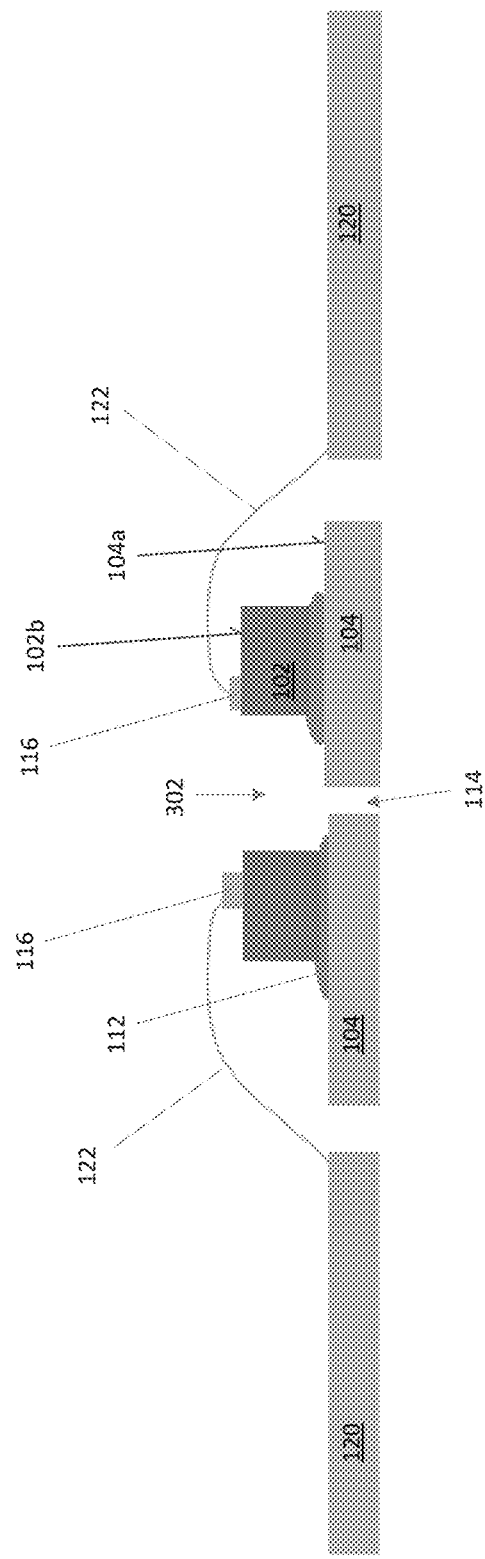

In FIG. 8B, bond wires 122 are connected at one end to the electrical contacts 116 of the logic die 102 and to the leads 120 at the opposite end. Bond wires, ribbons, metal clips, etc. can be used to form these connections.

Figure 8C:
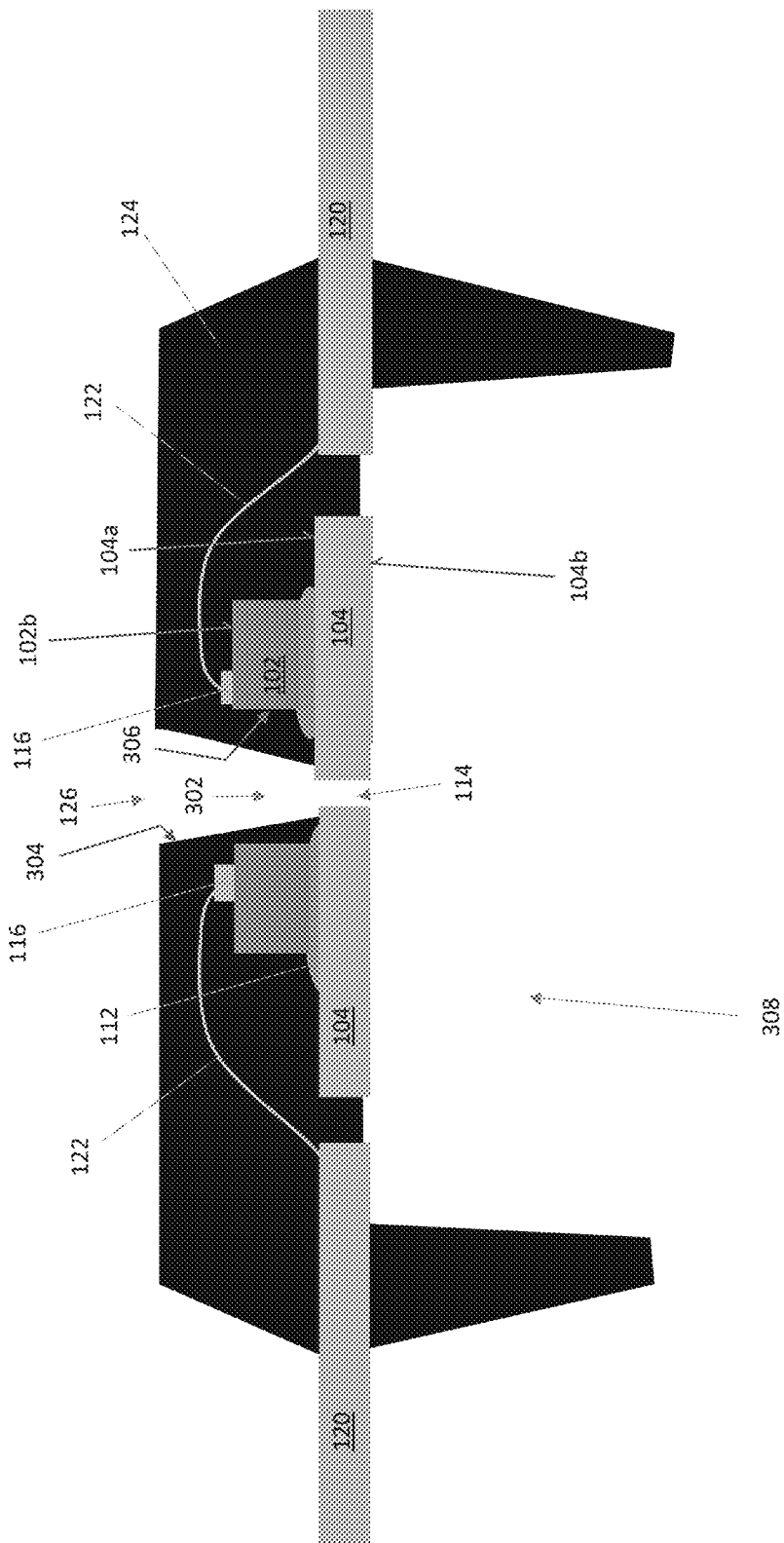

In FIG. 8C, the package assembly is molded in a molding tool. The molding tool is designed such that an open passage 126 is formed in the mold compound 124 which is aligned with the opening 302 in the logic die 102 and the opening 114 in the substrate 104. The pressure port of the pressure sensor package is further defined by the opening 302 in the logic die 102. Each sidewall 304 which defines the open passage 126 in the mold compound 124 extends to and terminates at the surface 104a of substrate 104 to which the logic die 102 is attached. Each sidewall 306 which defines the opening 302 in the logic die 102 is therefore covered by the mold compound 124. The molding tool is further designed such that the resulting premolded package assembly has a cavity 308 in the mold compound 124 at the opposite side 104b of the substrate 104 as the logic die 102. Any standard molding process can be used.

Figure 8D:
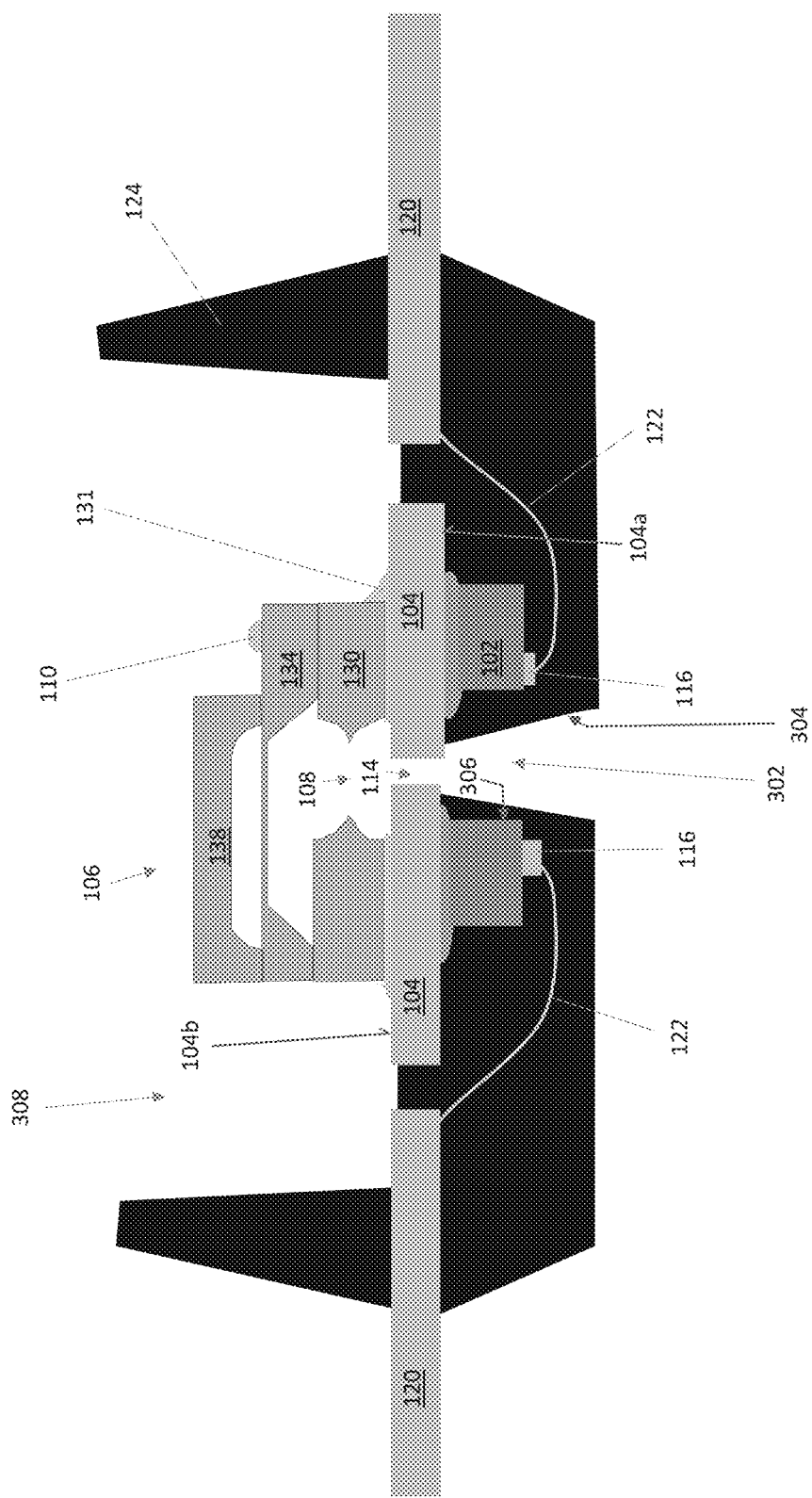

In FIG. 8D, the package assembly is flipped and the pressure sensor 106 is placed in the cavity 308 previously formed in the mold compound 124 and attached to the opposite side 104b of the substrate 104 as the logic die 102 using any standard die attach process such as soldering, gluing, etc.

Figure 8E:
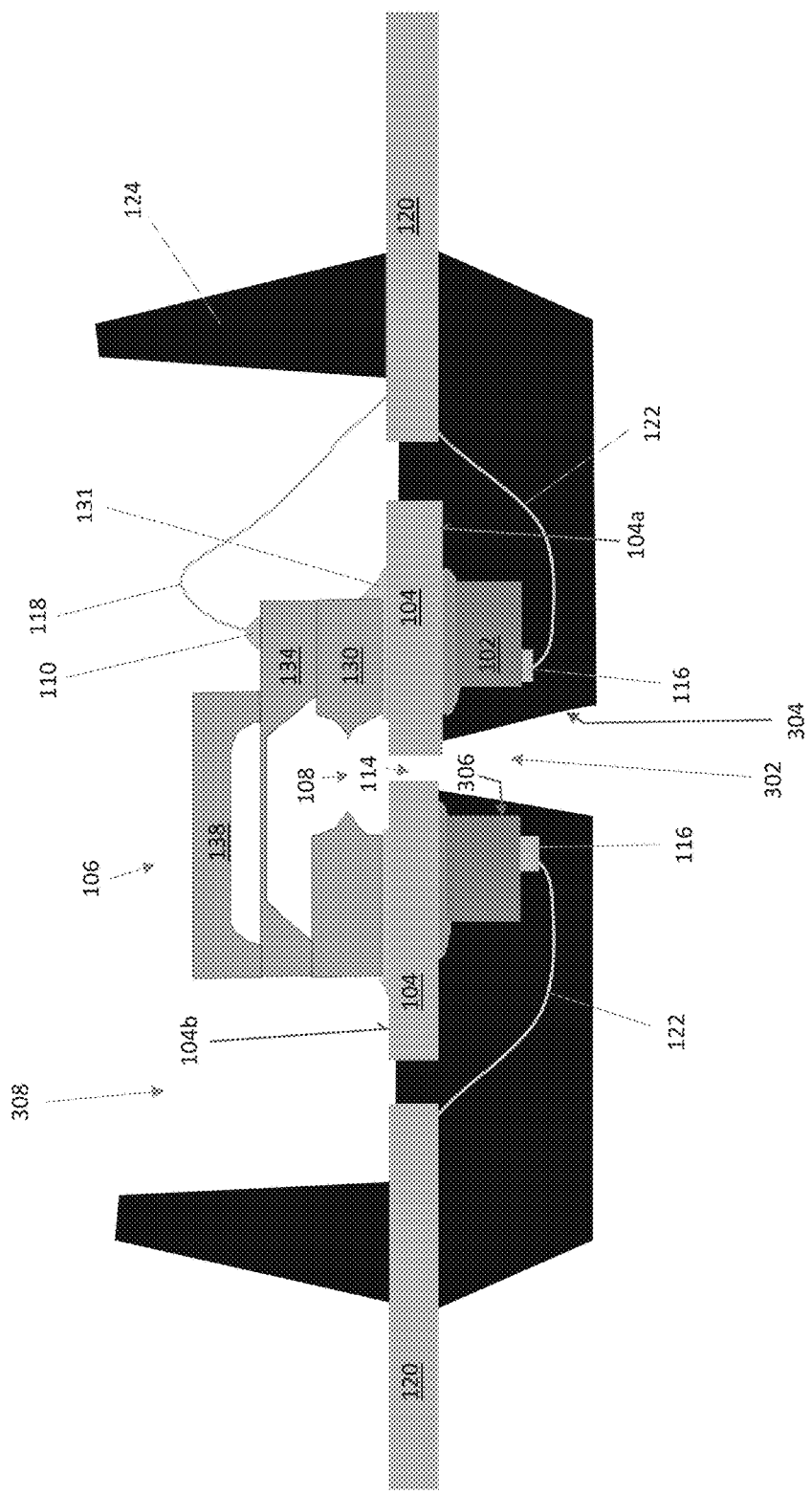

In FIG. 8E, bond wires 118 are connected at one end to the electrical contacts 110 of the pressure sensor 106 and to the leads 120 at the opposite end. Bond wires, ribbons, metal clips, etc. can be used to form these connections.

Figure 8F:
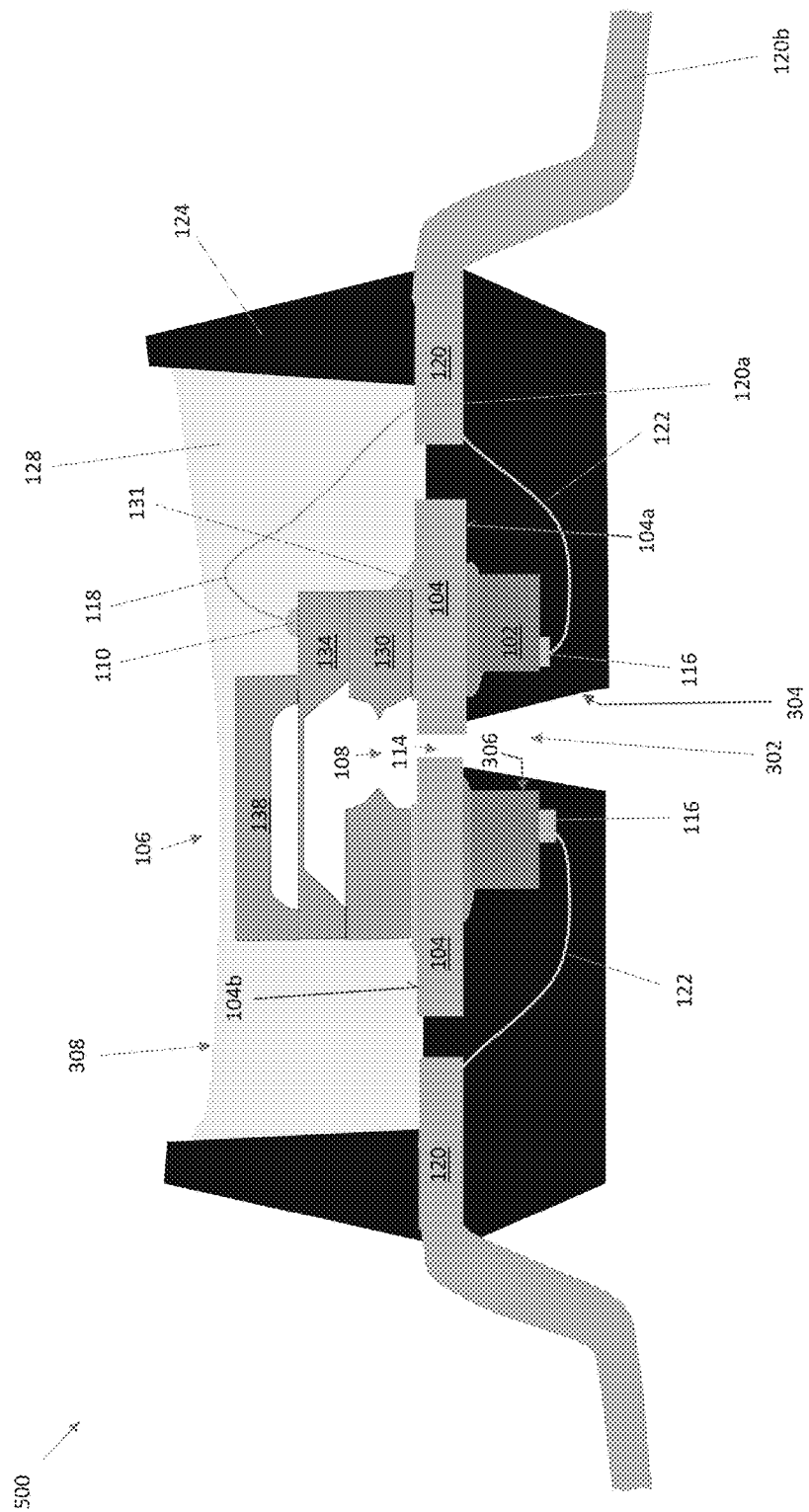

In FIG. 8F, the pressure sensor 106 and the bond wires 118 connected to the electrical contacts 110 of the pressure sensor 106 are covered with a silicone gel 128. The silicone gel 128 is subjected to a curing process. In the case of a lead frame-based substrate 104, the lead frame is then trimmed and the leads 120 can be bent if desired. Alternatively, the package assembly can be molded after both the logic die 102 and pressure sensor 106 are attached to opposite sides 104a, 104b of the substrate 104 and after the silicone gel 128 is provided and cured e.g. as described above in connection with FIG. 2F.

Figure 9:
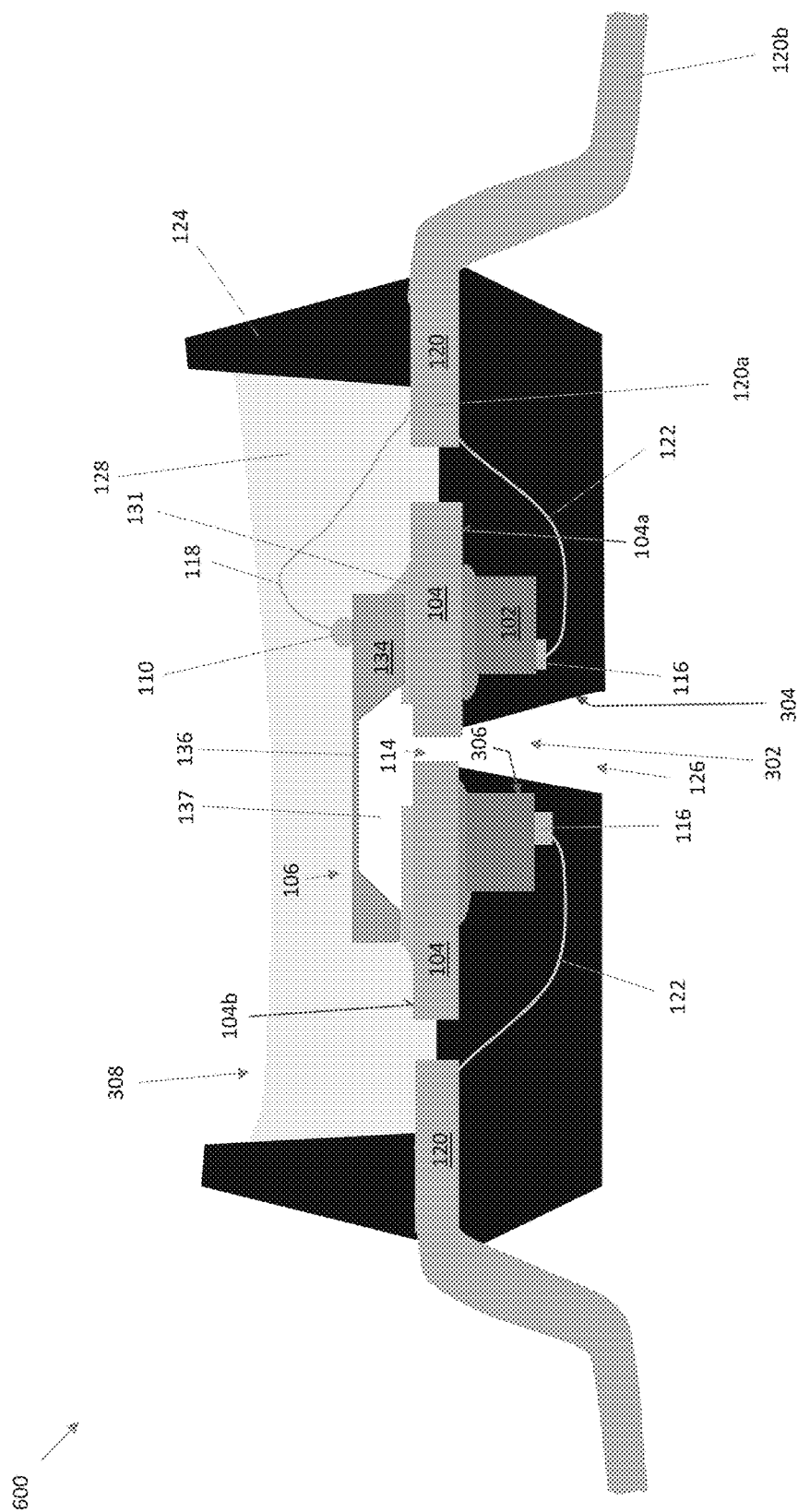
FIG. 9 illustrates a cross-sectional view of another embodiment of a pressure sensor package having a pressure sensor and a logic die attached to opposite sides of the same substrate.

FIG. 9 illustrates another embodiment of a pressure sensor package 600. The embodiment shown in FIG. 9 is similar to the embodiment shown in FIG. 7. Different, however, both glass substrates 130, 136 of the pressure sensor 106 are omitted. As such, the semiconductor die 134 of the pressure sensor 106 is attached to the opposite side 104b of the substrate 104 as the logic die 102 instead of a glass substrate. The pressure sensor semiconductor die 134 has a piezo-active suspended membrane 136 and a recessed region 137. The pressure port of the pressure sensor package 600 is further defined by the recessed region 137 of the pressure sensor semiconductor die 134 as previously described herein connection with FIG. 3.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A pressure sensor package, comprising:
   a substrate having an opening;
   a pressure sensor having a first side attached to the substrate and a second side opposite the first side, the first side having a pressure inlet aligned with the opening in the substrate, the second side having one or more electrical contacts;
   a logic die attached to an opposite side of the substrate as the pressure sensor and operable to process signals from the pressure sensor;
   first electrical conductors connected to the one or more electrical contacts of the pressure sensor;
   second electrical conductors connected to one or more electrical contacts of the logic die;
   a mold compound completely encapsulating the second electrical conductors and at least partly encapsulating the logic die and the first electrical conductors; and an open passage in the mold compound which is aligned with the opening in the substrate so as to define a pressure port of the pressure sensor package, wherein the logic die has an opening aligned with the open passage in the mold compound and the opening in the substrate, wherein the pressure port of the pressure sensor package is further defined by the opening in the logic die.

2. The pressure sensor package of claim 1, wherein the logic die and the pressure sensor at least partly overlap in a vertical direction perpendicular to the first side of the pressure sensor.

3. The pressure sensor package of claim 1, wherein each sidewall which defines the open passage in the mold compound terminates at a surface of the logic die facing away from the substrate, and wherein each sidewall which defines the opening in the logic die is uncovered by the mold compound.

4. The pressure sensor package of claim 1, wherein each sidewall which defines the open passage in the mold compound terminates at a surface of the substrate to which the logic die is attached, and wherein each sidewall which defines the opening in the logic die is covered by the mold compound.

5. The pressure sensor package of claim 1, wherein the substrate is a circuit board, a ceramic substrate or part of a lead frame.

6. The pressure sensor package of claim 1, wherein the first electrical conductors and the second electrical conductors comprise bond wires.

7. The pressure sensor package of claim 1, further comprising:

a plurality of leads embedded in the mold compound at a first end and protruding out of the mold compound at a second end, the second end of the leads forming external electrical contacts of the pressure sensor package, wherein the first electrical conductors connect the one or more electrical contacts of the pressure sensor to one or more of the leads, wherein the second electrical conductors connect the one or more electrical contacts of the logic die to one or more of the leads.

8. The pressure sensor package of claim 7, wherein the first end of the leads terminate in the mold compound at a different level than the substrate so that the first end of the leads and the substrate are vertically offset within the mold compound.

9. The pressure sensor package of claim 1, wherein:

the pressure sensor comprises a first glass substrate attached to the opposite side of the substrate as the logic die and having an opening which forms the pressure inlet, a semiconductor die stacked on the first glass substrate and comprising a membrane, and a second glass substrate stacked on the semiconductor die and comprising a cavity;

the pressure port of the pressure sensor package is further defined by the opening in the first glass substrate;

the opening in the first glass substrate is aligned with the membrane at one side of the membrane so as to permit air flowing into the pressure port to impinge upon the membrane; and the cavity in the second glass substrate is aligned with the membrane at an opposite side of the membrane as the first glass substrate so as to permit movement of the membrane in response to the air flow.

10. The pressure sensor package of claim 1, wherein:

the pressure sensor comprises a semiconductor die attached to the opposite side of the substrate as the logic die and having a membrane and a recessed region;

the pressure port of the pressure sensor package is further defined by the recessed region of the semiconductor die; and the recessed region of the semiconductor die is aligned with the membrane so as to permit air flowing into the pressure port to impinge upon the membrane.

11. The pressure sensor package of claim 1, further comprising a silicone gel covering the pressure sensor and part of the first electrical conductors, the silicone gel being interposed between the mold compound and the pressure sensor.

12. A method of manufacturing a pressure sensor package, the method comprising:

attaching a first side of a pressure sensor to a substrate which has an opening, the pressure sensor having a second side opposite the first side, the first side having a pressure inlet aligned with the opening in the substrate, the second side having one or more electrical contacts;

attaching a logic die to an opposite side of the substrate as the pressure sensor, the logic die operable to process signals from the pressure sensor;

connecting first electrical conductors to the one or more electrical contacts of the pressure sensor;

connecting second electrical conductors to one or more electrical contacts of the logic die;

completely encapsulating the second electrical conductors and at least partly encapsulating the logic die and the first electrical conductors in a mold compound;

forming an open passage in the mold compound which is aligned with the opening in the substrate so as to define a pressure port of the pressure sensor package; and aligning an opening in the logic die with the open passage in the mold compound and the opening in the substrate, wherein the pressure port of the pressure sensor package is further defined by the opening in the logic die.

13. The method of claim 12, wherein mold compound is formed such that each sidewall which defines the open passage in the mold compound extends to and terminates at a surface of the logic die facing away from the substrate and each sidewall which defines the opening in the logic die is uncovered by the mold compound.

14. The method of claim 12, wherein mold compound is formed such that each sidewall which defines the open passage in the mold compound extends to and terminates at a surface of the substrate to which the logic die is attached and each sidewall which defines the opening in the logic die is covered by the mold compound.

15. The method of claim 12, further comprising:

embedding a plurality of leads in the mold compound at a first end and such that the leads protrude out of the mold compound at a second end, the second end of the leads forming external electrical contacts of the pressure sensor package;

connecting the one or more electrical contacts of the pressure sensor to one or more of the leads via the first electrical conductors; and connecting the one or more electrical contacts of the logic die to one or more of the leads via the second electrical conductors.

16. The method of claim 12, wherein attaching the first side of the pressure sensor to the substrate comprises:

attaching a first glass substrate of the pressure sensor to the opposite side of the substrate as the logic die, the first glass substrate having an opening which forms the pressure inlet, the pressure sensor further having a semiconductor die stacked on the first glass substrate and comprising a membrane, and a second glass substrate stacked on the semiconductor die and comprising a cavity, wherein the pressure port of the pressure sensor package is further defined by the opening in the first glass substrate, wherein the first glass substrate is attached to the opposite side of the substrate as the logic die such that the opening in the first glass substrate is aligned with the membrane at one side of the membrane so as to permit air flowing into the pressure port to impinge upon the membrane, and the cavity in the second glass substrate is aligned with the membrane at an opposite side of the membrane as the first glass substrate so as to permit movement of the membrane in response to the air flow.

17. The method of claim 12, wherein the pressure sensor comprises a semiconductor die attached to the opposite side of the substrate as the logic die and having a membrane and a recessed region, wherein the pressure port of the pressure sensor package is further defined by the recessed region of the semiconductor die, the method further comprising:
aligning the recessed region of the semiconductor die with the membrane so as to perms air flowing into the pressure port to impinge upon the membrane.

18. The method of claim 12, further comprising:
covering the pressure sensor and part of the first electrical conductors with a silicone gel, the silicone gel being interposed between the mold compound and the pressure sensor.

19. A pressure sensor package, comprising:
a substrate having an opening;
a pressure sensor having a first side attached to the substrate and a second side opposite the first side, the first side having a pressure inlet aligned with the opening in the substrate, the second side having one or more electrical contacts;
a logic die attached to an opposite side of the substrate as the pressure sensor and operable to process signals from the pressure sensor;
first electrical conductors connected to the one or more electrical contacts of the pressure sensor;
second electrical conductors connected to one or more electrical contacts of the logic die;
a mold compound in direct contact with and completely covering the second electrical conductors and the one or more electrical contacts of the logic die, and at least partly encapsulating the first electrical conductors; and
an open passage in the mold compound which is aligned with the opening in the substrate so as to define a pressure port of the pressure sensor package.

* * * * *

UNITED STATES PATENT AND TRADEMARK OFFICE
CERTIFICATE OF CORRECTION

PATENT NO. : 9,952,110 B2  
APPLICATION NO. : 15/084232  
DATED : April 24, 2018  
INVENTOR(S) : S. Beer et al.

Page 1 of 1

It is certified that error appears in the above-identified patent and that said Letters Patent is hereby corrected as shown below:

Column 11, Line 26 (Claim 17, Line 8), please change "perms" to -- permit --.

Signed and Sealed this  
Tenth Day of July, 2018

Andrei Iancu  
*Director of the United States Patent and Trademark Office*